United States Patent
Kazama

(10) Patent No.: US 7,459,922 B2
(45) Date of Patent: Dec. 2, 2008

(54) MICROCONTACTOR PROBE ASSEMBLY HAVING A PLUNGER AND ELECTRIC PROBE UNIT USING THE SAME

(75) Inventor: Toshio Kazama, Ina (JP)

(73) Assignee: NHK Spring Co. Ltd., Yokohama-Shi (JP)

( * ) Notice: Subject to any disclaimer, the term of this patent is extended or adjusted under 35 U.S.C. 154(b) by 0 days.

(21) Appl. No.: 11/446,359

(22) Filed: Jun. 5, 2006

(65) Prior Publication Data

US 2006/0220666 A1   Oct. 5, 2006

Related U.S. Application Data

(62) Division of application No. 10/311,096, filed on Dec. 13, 2002, now Pat. No. 7,057,403.

(51) Int. Cl.
*G01R 31/02* (2006.01)
(52) U.S. Cl. .................. 324/754; 324/761
(58) Field of Classification Search ......... 324/754–761, 324/72.5, 133; 439/482, 824, 700, 840
See application file for complete search history.

(56) References Cited

U.S. PATENT DOCUMENTS

| | | | |
|---|---|---|---|
| 4,528,500 A | * 7/1985 | Lightbody et al. | 324/537 |
| 5,157,325 A | * 10/1992 | Murphy | 324/761 |
| 5,576,631 A | * 11/1996 | Stowers et al. | 324/761 |
| 5,990,697 A | 11/1999 | Kazama | 324/761 |
| 6,043,666 A | * 3/2000 | Kazama | 324/754 |
| 6,323,667 B1 | 11/2001 | Kazama | 324/761 |

(Continued)

FOREIGN PATENT DOCUMENTS

CN    0811287.0    3/2004

(Continued)

*Primary Examiner*—Vinh P Nguyen
(74) *Attorney, Agent, or Firm*—Nath Law Group; Jerald L. Meyer; Sung Y. Chung

(57) ABSTRACT

A microcontactor probe has an insulator (6, 7) formed with a support hole (8, 9) having an open end and a close end, a lead conductor (11) exposed inside the support hole (8, 9) at the close end, and a resilient conductive assembly (2, 3, 4) fitted in the support hole (8, 9) and kept from falling. The resilient conductive assembly (2, 3, 4) includes a first plunger (3) exposed outside at the open end, a second plunger (4) contacting the lead conductor (11), a tubular conductor portion (15*b*) on one (4) of the first and second plungers (3, 4), a stem part (3*a*) of the other one of the first and second plungers, at least a portion of the stem part establishing a substantially concentric relationship with the tubular conductor portion (15*b*) at least during a probe operation, the concentric relationship of the tubular conductor portion (15*b*) with the stem part (3*a*) minimizing resistance and induction during a probe operation, and a coil spring fitted on the first and second plungers, the coil spring (2) having a connected tight wound portion (15*a*) fixed to said one (4) of the first and second plungers (3, 4) at a fixed part (P) for conduction, the tight wound portion (15*a*) slidably contacting said other (4) of the first and second plungers (3, 4), whereby the tight wound portion (15*a*) minimizes resistance and induction during a probe operation.

6 Claims, 13 Drawing Sheets

U.S. PATENT DOCUMENTS 6,396,293 B1    5/2002    Vinther et al.
6,462,567 B1    10/2002   Vinther et al.

FOREIGN PATENT DOCUMENTS

| | | |
|---|---|---|
| DE | 88 12 068 | 2/1989 |
| EP | 0621 485 | 10/1994 |
| JP | 10-239349 | 9/1998 |
| JP | 10239349 | 9/1998 |
| WO | 98 29751 | 7/1998 |
| WO | 01 37381 | 5/2001 |
| WO | WO-02/04961 A2 | 1/2002 |

\* cited by examiner

MICROCONTACTOR PROBE ASSEMBLY HAVING A PLUNGER AND ELECTRIC PROBE UNIT USING THE SAME

CROSS-REFERENCE TO RELATED APPLICATIONS

This is a Division of U.S. patent application Ser. No. 10/311,096, filed Dec. 13, 2002 and published as US Publication US 2003/0137316, now U.S. Pat. No. 7,057,403.

BACKGROUND OF THE INVENTION

1. Technical Field

The present invention relates to a microcontactor probe, such as an electrically conductive miniature contactor, socketpin (SCP), or thinprobe (THP), that has a plunger as a needle member adapted for contact on a contact target, such as a liquid crystal display substrate, TAB, or package substrate (PKG), to take out an electric signal to be transmitted to external circuitry via a signal transmission line, such as a lead wire. The present invention further relates to an electric probe unit constituted with a plurality of microcontactor probes.

2. Background Art

Conventional electric probe units for electrical inspections, such as of a printed circuit board's conductor pattern or electronic device, employ microcontactor probes constituted with a plunger as a conductive needle member, a holder for holding the plunger to be axially movable to go in and out, and a coil spring for resiliently biasing the plunger in a direction for a projecting end thereof to project from a front end (as an axial end) of the holder, thereby allowing for the projecting end of the plunger to resiliently contact a contact target of an object to be inspected.

As such an example, there has been known a microcontactor probe 100 shown in FIG. 13, as it is disclosed in Japanese Patent Application Laid-Open Publication No. 10-239349, in which a plunger assembly 5 that has a pair of plungers 3 and 4 joined to both ends of a coil spring 2 is accommodated to be installed in support holes 8 and 9 formed in insulating holders 6 and 7, allowing for reciprocal movement of the paired plungers 3 and 4, while the installed plungers 3 and 4 are urged to project outward and prevented from falling.

In the installed condition, the plungers 3 and 4 accommodated in the support holes 8 and 9 are prevented from falling, with their stepped parts engaged either with the lower holder 6 and the other with the upper holder 7. The coil spring 2 has a tight wound spiral portion 2a in an intermediate part thereof. The intermediate tight wound spiral portion 2a has a length for stem parts 3a and 4a of the plungers 3 and 4 to contact thereto in a waiting state (the state in which the plunger 3 is not brought into contact on an inspection target).

The above-noted probe 100 is used for inspection, in an electrically connected condition in which a projecting end of the upper plunger 4 resiliently contacts a lead conductor 11 that is fixed to a wiring plate 10 laminated on the holder 7, by bringing a projected end of the lower plunger 3 into resilient contact on the inspection target 12 of the object of inspection. In the inspection, a conduction path L of electronic signal develops, as shown by solid line arrows in FIG. 13, extending from the inspection target 12 to the lower plunger 3, for conduction from the stem part 3a to the step part 4a of the upper plunger 4 via the intermediate tight wound spiral portion 2a, and passing the upper plunger 4, leading to the lead conductor 11, whereby the inspection target 12 as a printed circuit formed on the substrate 13 can be inspected for short-circuiting or disconnection.

In this condition, the conduction path L that has to pass the single coil spring 2 includes the intermediate tight wound spiral portion 2a, where significant fractions of electric signals are linearly conducted in an axial direction of the coil spring 2, thus preventing a high-frequency signal from flowing a coarse wound spiral portion of the coil spring 2 which would have an additional inductance and an additional resistance.

In the microcontactor probe 100, however, the conduction path L includes, as shown in FIG. 13, lower and upper sliding portions A and B for conduction between the intermediate tight wound spiral portion 2a and the stem parts 3a and 4a of the lower and upper plungers 3 and 4, respectively, which two sliding portions A and B for conduction cause dispersion of resistance, resulting in a reduced accuracy of inspection, as a problem.

Further, the microcontactor probe 100 goes unstable if the contact pressure to be exerted by the plunger 3 on the inspection target 12 is not great to some extent, as it gives rise to a high contact resistance due to such a cause as a failure to break an oxidized skin of the inspection target 12 for example. There is thus required a great contact pressure, which however is concurrently exerted via the plunger 4 also on the lead conductor 11, which means that in application to a mass production the lead conductor 11 is subjected to a great contact pressure imposed thereon every test (that amounts to hundreds of thousands to millions times), resulting in a reduced service life at the substrate 13 (or the wiring plate 10) due to an early rupture or the like, as another problem.

DISCLOSURE OF INVENTION

It therefore is an object of the present invention to provide a microcontactor probe and an electric probe unit, in which a conduction path has a reduced number of sliding portions for conduction, without increase in inductance nor resistance, thereby permitting an enhanced accuracy of inspection.

To achieve the object, according to an aspect of the present invention, there is provided a microcontactor probe comprising: an insulator formed with a support hole having an open end and a close end; a lead conductor exposed inside the support hole at the close end; and a resilient conductive assembly fitted in the support hole and kept from falling, the assembly comprising a first conductor portion exposed outside at the open end, and a second conductor portion contacting the lead conductor, wherein one of the first and second conductor portions comprises a tubular conductor portion slidably contacting at one part thereof on the other of the first and second conductor portions, and a fixed conductor portion fixed to another part of the tubular conductor portion. According to this aspect of the present invention, the tubular conductor portion which has a single sliding contact still can reduce inductance at high frequencies.

Preferably, the first conductive portion may comprise a first plunger, the second conductive portion may comprise a second plunger and a coil spring, and the tubular conductor portion may comprise a tight wound portion of the coil spring.

Or preferably, the first conductive portion may comprise a first plunger and a coil spring, the second conductive portion may comprise a second plunger, and the tubular conductor portion may comprise a tight wound portion of the coil spring.

Or preferably, the first conductive portion may comprise a first plunger formed with a hollow, the second conductive portion may comprise a second plunger and a coil spring, and the tubular conductor portion may comprise a tubular part of the first plunger defining the hollow.

Or preferably, the first conductive portion may comprise a first plunger with a hollow and a coil spring, the second conductive portion may comprise a second plunger, and the tubular conductor portion may comprise a tight wound portion of the coil spring.

Or preferably, the first conductive portion may comprise a first plunger, the second conductive portion may comprise a second plunger with a hollow and a coil spring, and the tubular conductor portion may comprise one of a tight wound portion of the coil spring and a tubular part of the second plunger defining the hollow.

Further, to achieve the object described, according to another aspect of the present invention, there is provided an electric probe unit comprising a plurality of microcontactor probes.

BRIEF DESCRIPTION OF DRAWINGS

The above and further objects and novel features of the present invention will more fully appear from the following detailed description when the same is read in conjunction with the accompanying drawings, in which.

BEST MODE FOR CARRYING OUT THE INVENTION

Figure 1:
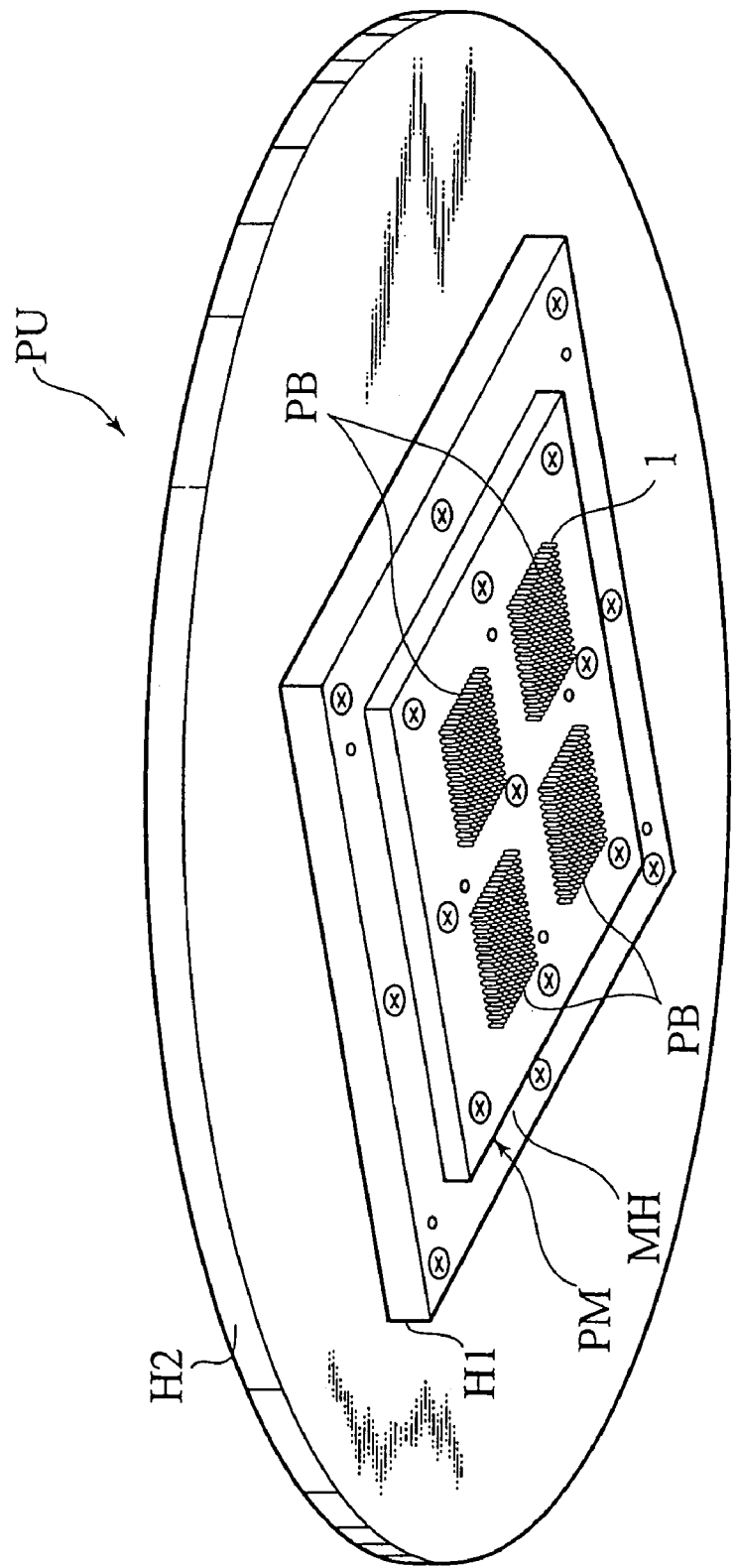
FIG. 1 is a perspective view of an electric probe unit according to an embodiment of the invention.

There will be detailed below embodiments of the present invention with reference to the accompanying drawings. Like members are designated by like reference characters.

FIG. 1 shows an electric probe unit PU according to a first embodiment of the invention. The probe unit PU is constituted as a probe card, including a both-sided performance board H2 as a relatively large substrate and a substantially flat transformer H1 as a relatively small repeating substrate fastened to a downside of the performance board H2 by screws, and with at least one electric probe module PM fastened to a downside of the transformer H1 by screws. The probe unit PU is supported by a computer-aided multi-axis positioning robot called "tester" (not shown), so that the probe module PM can be set in an arbitrary position within a designed spatial region with an optimal attitude for inspection of a target (not shown), such as a printed circuit board, a micro chip, or a semiconductor wafer, to be probed by electrical contact for acquisition or sampling of current data or signals, such as of current conduction or performance checks.

The electric probe module PM is constituted by a substantially flat insulating module housing MH, which is fastened to the transformer H1, and a target-dedicated array of a plurality of (four in this case) electric probe blocks PB each respectively made up by a matrix of hundreds or thousands of microcontactor probes 1 incorporated in the module housing MH, with their contacting lower ends exposed outside, at designed distances of approx. 0.15 mm for example. Each probe 1 is connected to a corresponding lead conductor in a wiring plate laminated in the transformer H1. If the unit PU is for low-frequency service, the lead conductor may be connected to an external connection wire.

Figure 2:
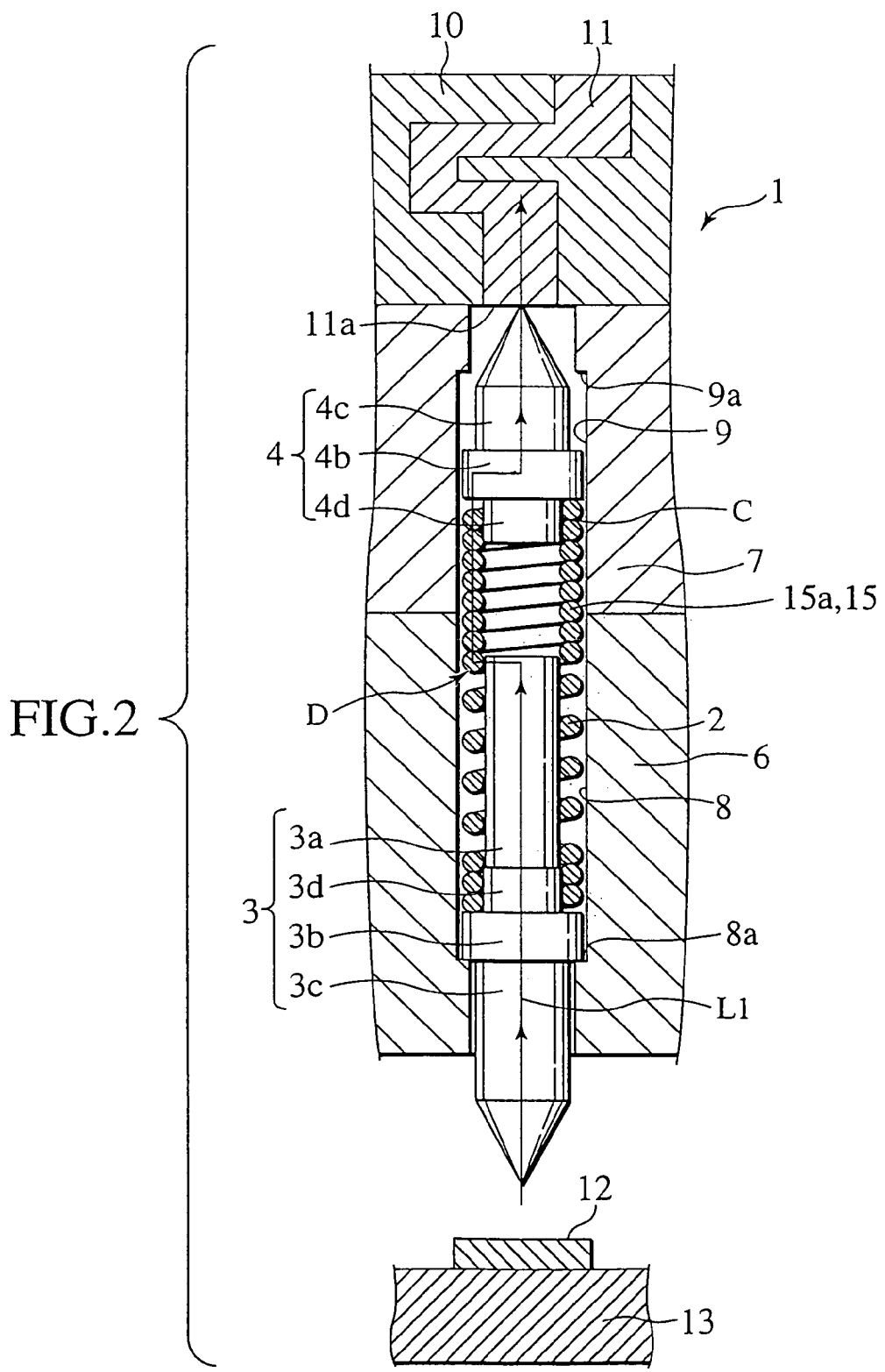
FIG. 2 is a longitudinal section of a microcontactor probe of the electric probe unit of FIG. 1.

FIG. 2 shows an arbitrary microcontactor probe 1 of the electric probe unit PU of FIG. 1.

The probe unit PU has a lower probe holder 6 as an insulating plate member fixed in the module housing MH, an upper probe holder 7 as an insulating plate member laminated on the lower probe holder 6, and a wiring plate 10 as an insulating substrate laminated on the upper probe holder 7 and formed with lead conductors 11. The probe holders 6 and 7 and the wiring plate 10 are joined tight. For each probe 1, the lower holder 6 has a cylindrical lower support hole 8 formed therethrough with an inward step 8a provided near the lower end to define a diameter-reduced end part, and the upper holder 7 has a cylindrical upper support hole 9 formed therethrough with an inward step 9a provided near the upper end to define a diameter-reduced end part. Between the steps 8a and 9a, the lower and upper support holes 8 and 9 have a matching larger diameter than at the diameter-reduced end parts. A corresponding lead conductor 11 is exposed at its lower end to an inside of the upper end of the upper support hole 9.

The probe 1 is constituted with a lower plunger 3 as a conductive needle member flanged at an intermediate part 3b to be axially slidably fitted in a large-diameter portion of the lower support hole 8, an upper plunger 4 as a conductive needle member flanged at an intermediate part 4b to be axially slidably fitted in a large-diameter portion of the upper support hole 9, and a coil spring 2 slidably fitted in the large-diameter portions of the support holes 8 and 9 and compressed between the flanged parts 3b and 4b of the lower and upper plungers 3 and 4, so that the plungers 3 and 4 are normally biased in opposite directions. As a result, the lower plunger 3 is pressed at the flanged part 3b against, and kept from falling by, the step 8a of the lower support hole 8, with a conical tip of a needle head part 3c thereof projecting outside, and the upper plunger 4 is pressed at a conical tip of a needle head part 4c thereof against a pad 11a as a lower end of the lead conductor 11. The lower plunger 3 as well as the upper plunger 4 is made of a tool steel (SK) prepared with a Ni-plate and finished by an Au-plate with an outside diameter of 0.1 mm. The coil spring 2 is made of a spirally formed piano wire (SWPA) prepared with a Ni-plate 0.3 mm thick and finished by an Au-plate 0.3-0.5 micrometer thick.

The lower plunger 3 has a boss part 3d above the flanged part 3b, and a stem part 3a extending upward above the boss part 3d. The upper plunger 4 has a boss part 4d under the flanged part 4b. The coil spring 2 has a tight wound spiral portion 15a constituting a relatively long tubular portion 15 in the upper part, another tight wound spiral portion constituting a short tubular portion at the lower end, and a coarse wound spiral portion extending therebetween. In each tubular portion, wide regions of Au plates on neighboring spiral parts of the spring 2 are brought into tight contact, so that a significant fraction of electric current can be substantially linearly conducted in the axial direction. The long tubular portion 15 is press-fitted so as to be fixed firm for current conduction at its upper end, in an integrating manner onto the boss part 4d of the upper plunger 4. The short tubular portion also is press-fitted so as to be fixed firm for current conduction, on the boss part 3d of the lower plunger 3. The coarse wound spiral portion is loose fitted about the stem part 3a of the lower plunger 3. This stem part 3a is slidably fitted for electrical connection at its top, into a lower part of the long tubular portion 15.

In the first embodiment, the tubular portion 15, which is formed as the tight wound spiral portion 15a at one end of the coil spring 2, is fixed firm on the upper plunger 4, while the lower plunger 3, which has the stem part 3a slidably contacting the tight wound spiral portion 15a, is tight fitted in the other end of the coil spring 2.

More specifically, the lower plunger 3, which has the flanged part 3b, has the needle head part 3c formed on one side of the flanged part 3b, and the stem part 3a as a relatively long shaft part integrally formed on the other side of the flanged part 3b via the boss part 3d. The stem part 3a has a length that allows for its distal end to reach the tight wound spiral part 15a when it is in a waiting state (the state in which the lower plunger 3 is kept from contacting a target 12 of inspection) as shown in FIG. 2, and is formed with a slightly smaller diameter than the boss part 3d. The upper plunger 4, which has the flanged part 4b, has the needle head part 4c formed on one side of the flanged part 4b, and the boss part 4d formed on the other side of the flanged part 4b.

The coil spring 2 has the tight wound spiral portion 15a at one end, and the coarse wound spiral portion in the remaining part. In the tight wound spiral portion 15a is tight fitted the upper plunger 4 by press-fitting the boss part 4d, and in the relatively short tight wound spiral portion at the end of the coarse wound spiral portion is tight fitted the lower plunger 3 by inserting the boss part 3d as well as the stem part 3a inside the coil and having the coil end wound tight on the boss part 3d. The tight wound spiral portion 15a has its axial length determined so that the axial distance between the stem part 3a and the boss part 4d permits the lower plunger 3 to be adequately operable for inspection.

A resiliently expansive and compressive conductive assembly of those conductors (i.e. coil spring 2 and lower and upper plungers 3 and 4 in this case), hereinafter called "plunger assembly", is installed in the holders 6 and 7, with the upper plunger 4 positioned in the support hole 9 of the holder 7 and with the lower plunger 3 positioned in the support hole 8 of the holder 6. In the installed condition, the lower and upper plungers 3 and 4, which have the needle head parts 3c and 4c projected at their distal ends outside the holders 6 and 7, respectively, are reciprocally movably accommodated in the support holes 8 and 9, and prevented from falling, irrespective of resilient forces of the coil spring 2, by the flanged parts 3b and 4b abutting on the steps 8a and 9a of the support holes 8 and 9.

The probe 1 is constituted with the wiring plate 10 laminated on the upside of the holder 7. By the lamination, the upper plunger 4 is forced back inside the support hole 9, against resilient forces of the coil spring 2, with the needle head part 4c resiliently contacting at its distal end on the pad 11a of the lead conductor 11 of the wiring plate 10, thereby permitting electrical connection.

The probe 1 thus constituted can be used for inspection by bringing the needle head part 3c into resilient contact at the conical tip on the inspection target 12 formed on the substrate 13. In the inspection, a conduction path L1 of electronic signal develops, as shown by solid line arrows in FIG. 2, extending from the inspection target 12 to the lower plunger 3, for conduction from the stem part 3a to the upper plunger 4 via the tight wound spiral portion 15a, and passing the upper plunger 4, leading to the (pad 11a) of the lead conductor 11, whereby the inspection target 12 as a printed circuit formed on the substrate 13 can be inspected for short-circuiting or disconnection.

Like this, in the microcontactor probe 1, the paired plungers 3 and 4 biased in opposite directions by the coil spring 2 are electrically interconnected via the tight wound spiral portion 15a (as the tubular portion 15), thus preventing a high-frequency signal from flowing the coarse wound spiral portion of the coil spring 2 which has an additional inductance and an additional resistance. There can be achieved reduction of inductance and resistance.

Further, because the tight wound spiral portion 15a (as the tubular portion 15) is in an integrated condition for electrical conduction relative to the plunger 4, there is an interconnecting portion C therebetween that can serve as a fixed part for conduction, not a sliding part therefor. Under this condition, the conduction path L1 constituted with the paired plungers 3 and 4 and the tight wound spiral portion 15a (as the tubular portion 15) has a single portion as a sliding portion D for conduction, where the stem part 3a of the plunger 3 is brought into sliding contact, thereby permitting the dispersion of resistance to be minimized in inspection.

Figure 3:
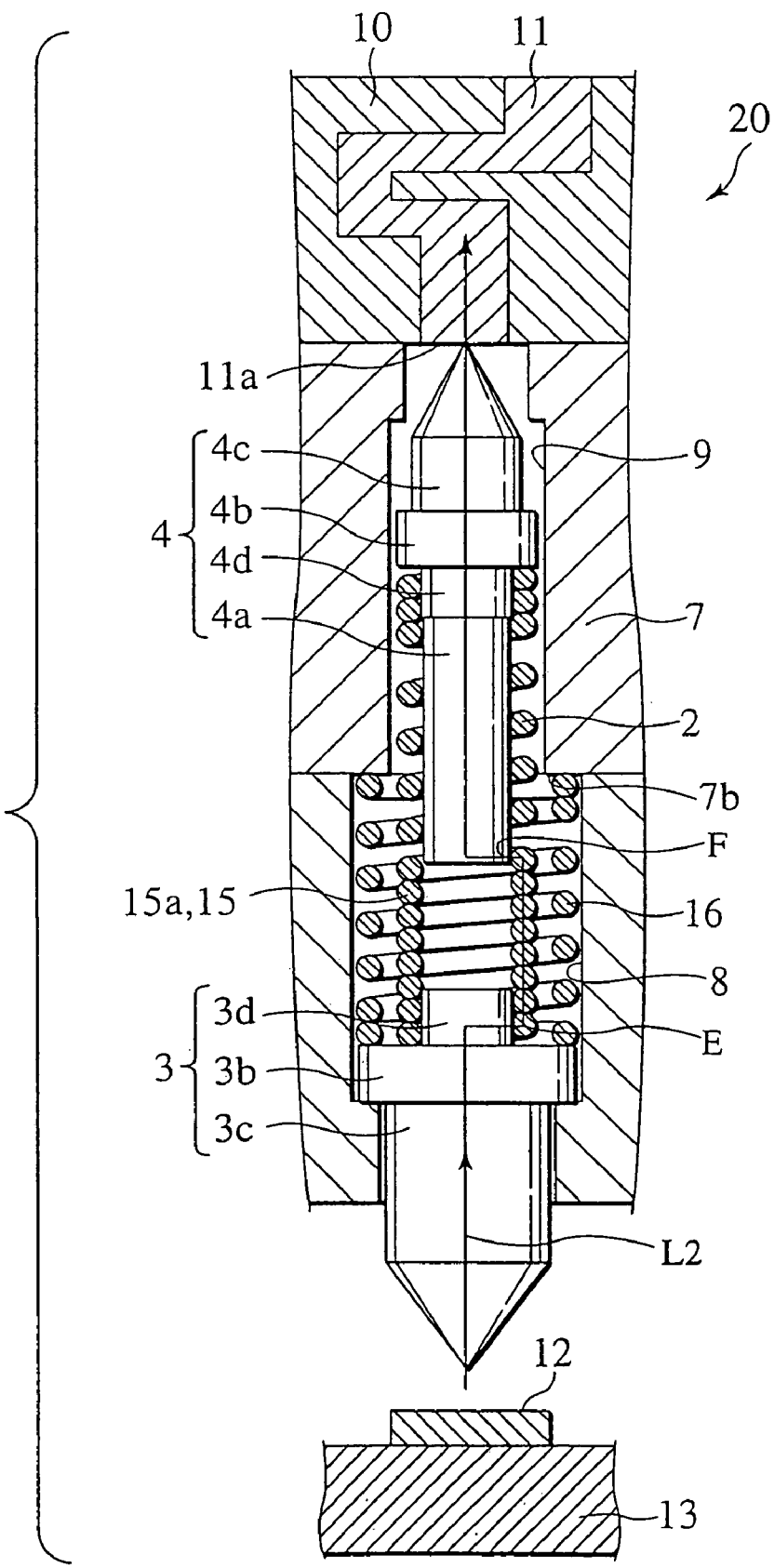
FIG. 3 is a longitudinal section of a microcontactor probe of an electric probe unit according to another embodiment of the invention.

FIG. 3 shows a microcontactor probe 20 according to a second embodiment of the present invention. Like members having the same functions as those in the first embodiment are given like reference characters and will not be described in detail.

The probe 20 has paired lower and upper plungers 3 and 4. The lower plunger 3 to be brought into contact with a target 12 of inspection is biased by an auxiliary spring 16 extended between the lower plunger 3 and an upper probe holder 7 under a larger spring load than the upper plunger 4 connected with a wiring plate 10.

More specifically, the lower plunger 3 has a flanged part 3b, on one side of which part 3b a needle head part 3c is formed, and on the other side of which part 3b, a boss part 3d is integrally formed. The upper plunger 4 has a flanged part 4b, on one side of which part 4b a needle head part 4c is formed, and on the other side of which part 4b, a long stem part 4a is integrally formed via a boss part 4d. The stem part 4a has a length that permits one end thereof to reach a tight wound spiral portion 15a in a waiting state (the state in which the lower plunger 3 is kept from contacting a target 12 of inspection), and has a diameter slightly smaller than that of the boss part 4d.

In the second embodiment, as in the first embodiment, a tubular portion 15 comprises the tight wound spiral portion 15a formed on one side of a coil spring 2. The lower plunger 3 is firmly fixed with the boss part 3d press-fitted into the tight wound spiral portion 15a. The upper plunger 4 is joined to an end of a coarse wound spiral portion with the stem part 4a and the boss part 4d inserted into the coil and the coil end tight wound on the boss part 4d.

With the plunger assembly thus constituted, as in the first embodiment, the upper plunger 4 is positioned in a cylindrical upper support hole 9 of a holder 7 and the lower plunger 3 is positioned in a cylindrical lower support hole 8 of a holder 6 to be mounted to the holders 7 and 6, and the wiring plate 10 is stacked on an upper side of the holder 7, whereby the needle head part 4c of the upper plunger 4 is brought into contact with a pad 11a of a lead conductor 11 to provide electrical connection.

In the second embodiment, the auxiliary spring 16 is made of a coil spring and is positioned outside of the coil spring 2 resiliently biasing the paired plungers 3 and 4, thereby to provide a coaxial double coil spring structure with the coil spring 2.

More specifically, the auxiliary spring 16 is made of a coil spring having an adequately larger diameter than the coil spring 2 and is inserted into the support hole 8 formed to have an adequately larger diameter than the support hole 9, to be extended between a bottom surface 7b of the holder 7 and the flanged part 3b formed to have an adequately larger diameter.

With the microcontactor prove 20 thus constituted, the conical tip of the needle head part 3c of the lower plunger 3 is brought into resilient contact with the target 12 of inspection formed on a substrate 13 for inspection. As shown by solid line arrows in FIG. 3, a conduction path L2 of signals in inspection extends from the target 12 through the lower plunger 3 to reach the tight wound spiral portion 15a, and extends through the portion 15a to the upper plunger 4, and reaches the lead conductor 11 (pad 11a) through the plunger 4.

In this state, the tight wound spiral portion 15a (tubular portion 15) is in an integrally conductive state with the lower plunger 3, and a connecting portion E thereof is not a sliding conductive portion but a fixed conductive portion. Under this condition, the conduction path L2 constituted with the paired plungers 3 and 4 and the tight wound spiral portion 15a (tubular portion 15) has a single portion as a sliding portion F for conduction, where the stem part 4a of the upper plunger 4 is brought into sliding contact with the tight wound spiral portion 15a (tubular portion 15), thereby permitting the dispersion of resistance to be minimized in inspection.

Further, in the microcontactor probe 20, a total spring load of the coil spring 2 and the auxiliary spring 16 acts on the lower plunger 3, so that the lower plunger 3 can be brought into resilient contact with the target 12 of inspection at a larger contact pressure. On the contrary, a spring load of the coil spring 2 only acts on the upper plunger 4, so that the upper plunger 4 can be brought into resilient contact with the wiring plate 10 (pad 11a) under a smaller contact pressure.

Thus, in addition to the functional effects of the above-described microcontactor probe 1, the microcontactor probe 20 prevents decrease in stability of contact with the target 12 of inspection, minimizing damage to the wiring plate 10 (pad 11a), thereby increasing the life of the wiring plate 10.

Further, the microcontactor probe 20 has the auxiliary spring 16 mounted to provide a coaxial double spring coil structure with the coil spring 2 that can be mounted in a small space, which does not increase the size of the device.

Furthermore, the microcontactor probe 20 has a double coil spring structure comprising a coil spring as the auxiliary spring 16 and the tight wound spiral portion 15a of the coil spring 2 in a non-interference structure where the both springs do not engage with each other, which ensures proper inspection. Another non-interference structure can be realized with a double structure of two coil springs having opposite winding directions.

Figure 4:
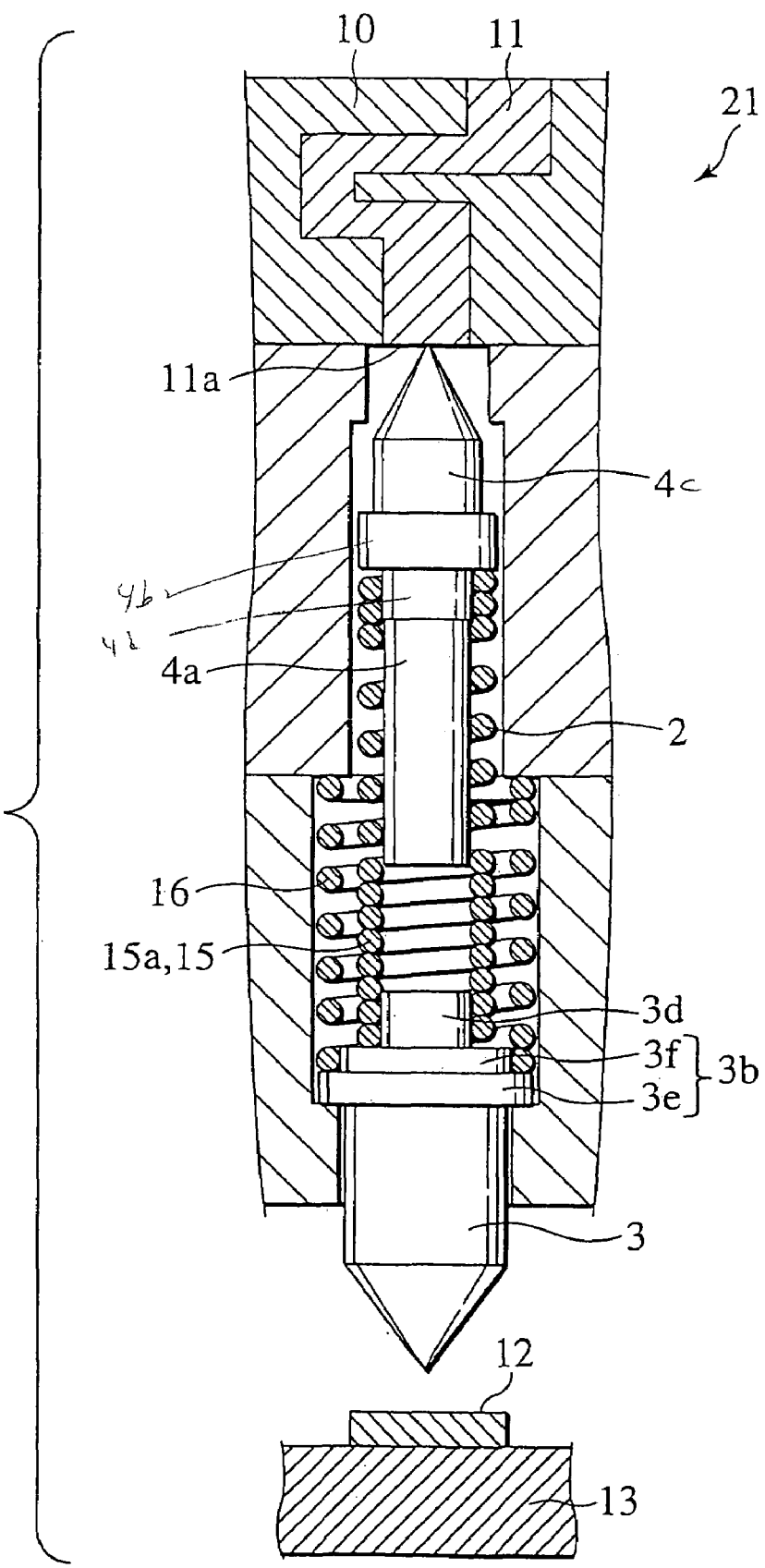
FIG. 4 is a longitudinal section of a microcontactor probe of an electric probe unit according to another embodiment of the invention.

FIG. 4 shows a microcontactor probe 21 according to a third embodiment of the present invention. The probe 21 has the same structure as that of the above-described microcontactor probe 20 except that it has a stepped flanged part 3b in a lower plunger 3.

More specifically, the flanged part 3b of the plunger 3 according to the third embodiment is constituted with a large-diameter flanged part 3e having a larger diameter than that of an auxiliary spring 16 and contacting a coil end of the auxiliary spring 16, and a small-diameter flanged part 3f integrally formed on one side of the large-diameter flanged part 3e and insertable into the coil of the auxiliary spring 16, on which part 3f a boss part 3d is formed.

Thus the microcontactor probe 21 properly has the same functional effects as those of the microcontactor probe 20 and also secures stable operation of the lower plunger 3 by mounting the plunger 3 with the small-diameter flanged part 3f inserted into the coil of the auxiliary spring 16.

Figure 5:
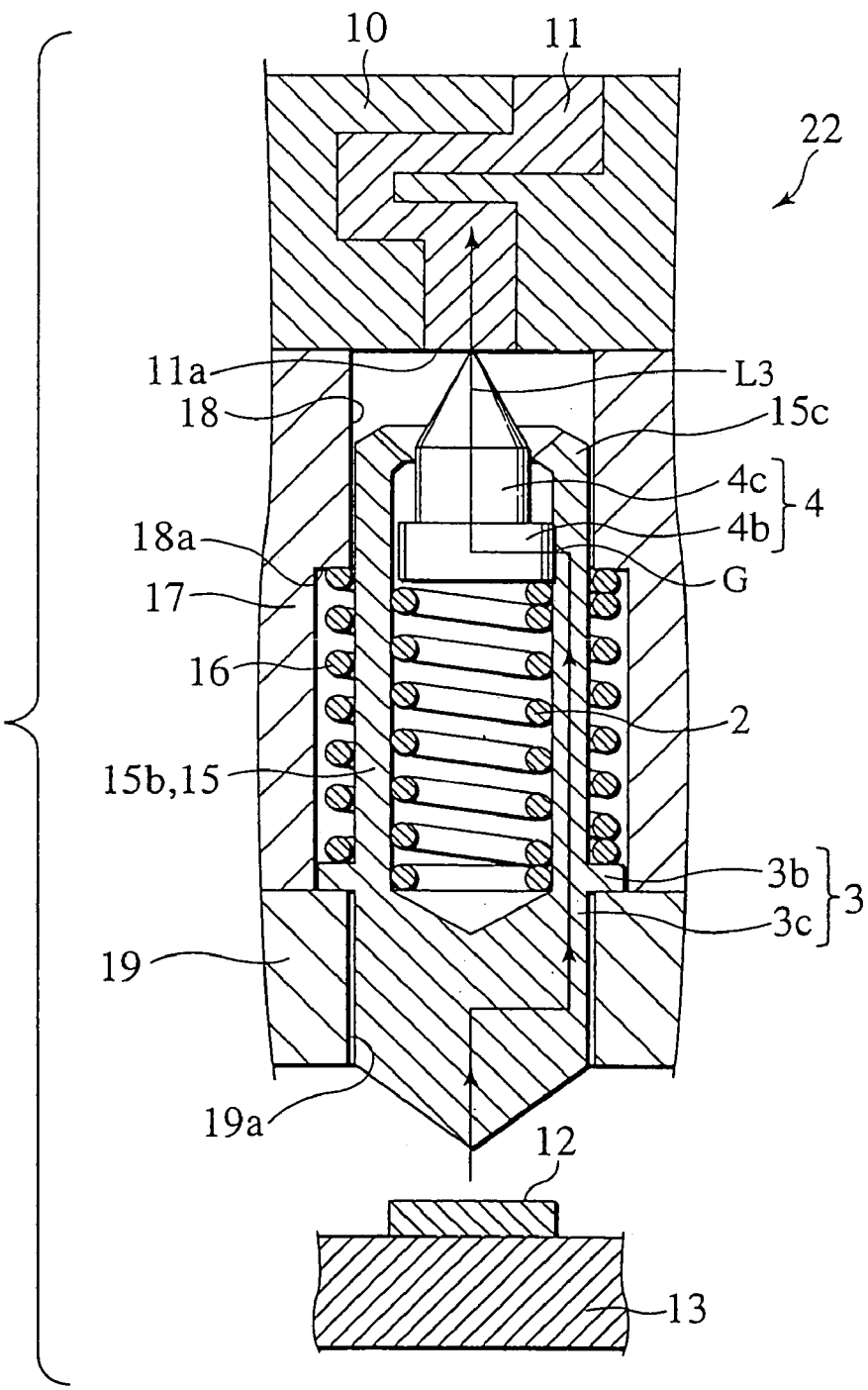
FIG. 5 is a longitudinal section of a microcontactor probe of an electric probe unit according to another embodiment of the invention.

FIG. 5 shows a microcontactor probe 22 according to a fourth embodiment of the present invention. The probe 22 has a tubular portion 15 made of a tubular part 15b as an extension of a lower plunger 3. An upper plunger 4 is slidably inserted into the tubular part 15b. A coil spring 2 is inserted into the tubular part 15b to be mounted to bias the plungers 3 and 4 in opposite directions.

In the microcontactor probe 22, an auxiliary spring 16 is made of a coil spring and is extended outside the tubular part 15b.

More specifically, the lower plunger 3 is constituted with a needle head part 3c and a flanged part 3b formed on the outer periphery of the proximal end of the needle head part 3c. The tubular part 15b is extended from the proximal end of the plunger 3 in the opposite direction to the needle head part 3c. The tubular part 15b has an internal flanged part 15c facing inward at its front end.

The upper plunger 4 is constituted with a needle head part 4c and a flanged part 4b formed on the outer periphery of the proximal end of the needle bead part 4c, and is biased with a coil spring 2 inserted into the tubular part 15b to be slidably mounted in the tubular part 15b, in which the conical tip of the needle head part 4c projects outside the internal flanged part 15c, and the flanged part 4b will abut against the internal flanged part 15c to be prevented from coming out. The plunger assembly thus constituted is mounted in a support hole of a holder.

In this embodiment, the holder is constituted with a thick holder 17 and a thin holder 19 stacked on a lower surface of the thick holder 17. The thick holder 17 has a stepped support hole 18 comprising an upper small-diameter portion and a lower large-diameter portion with a step 18a as a boundary. The thin holder 19 has a support hole 19a of a small diameter communicating with the lower large-diameter portion of the stepped support hole 18. The upper small-diameter portion has a diameter allowing the tubular part 15b to slide therethrough.

The plunger assembly of this embodiment is mounted in a manner that the conical tip of the needle head part 3c projects outside the support hole 19a, the flanged part 3b abuts against an upper surface of the thin holder 19 to prevent falling, un upper end of the tubular part 15b is positioned in the upper small-diameter portion of the support hole 18, and the conical tip of the needle head part 4c projects outside the upper small-diameter portion.

The microcontactor prove 22 further has a wiring plate 10 stacked on an upper surface of the holder 17 and an auxiliary spring 16 extended outside the tubular part 15b between the step 18a and the flanged part 3b. The upper plunger 4 is pushed back into the tubular part 15b against spring force of the coil spring 2. The conical tip of the needle head part 4c is brought into contact with a pad 11a of a lead conductor 11 of the wiring plate 10 for electrical connection.

A conduction path L3 of signals in inspection with the microcontactor probe 22 extends, as shown by solid line arrows in FIG. 5, from a target 12 of inspection through the lower plunger 3 and the tubular part 15b formed integrally with the plunger 3, to the upper plunger 4, to reach the lead conductor 11 (pad 11a) through the plunger 4.

Thus the conduction path L3 in this embodiment is constituted with the paired plungers 3 and 4 and the tubular part 15b, in which the plunger 3 and the tubular part 15b integrally constitute a continuous conduction path. Under this condition, the conduction path L3 has a single portion as a sliding portion G for conduction, where the plunger 4 is brought into contact with the tubular part 15b, thereby permitting the dispersion of resistance to be minimized in inspection.

Further, in this microcontactor probe 22, a small contact pressure by the coil spring 2 allows the plunger 4 to be brought into contact with the pad 11a, and a large contact pressure caused by a total spring load of the coil spring 2 and the auxiliary spring 16 allows the plunger 3 to be brought into contact with the target 12 of inspection.

Thus the microcontactor probe 22 has the same functional effects as those of the above-described microcontactor prove 20.

Further, the microcontactor probe 22 has a non-interference structure with the tubular part 15b where the auxiliary spring 16 and coil part of the spring coil 2 inside the tubular part 15b are not engaged with each other. This ensures proper inspection without interference between the auxiliary spring 16 and the coil spring 2.

Figure 6:
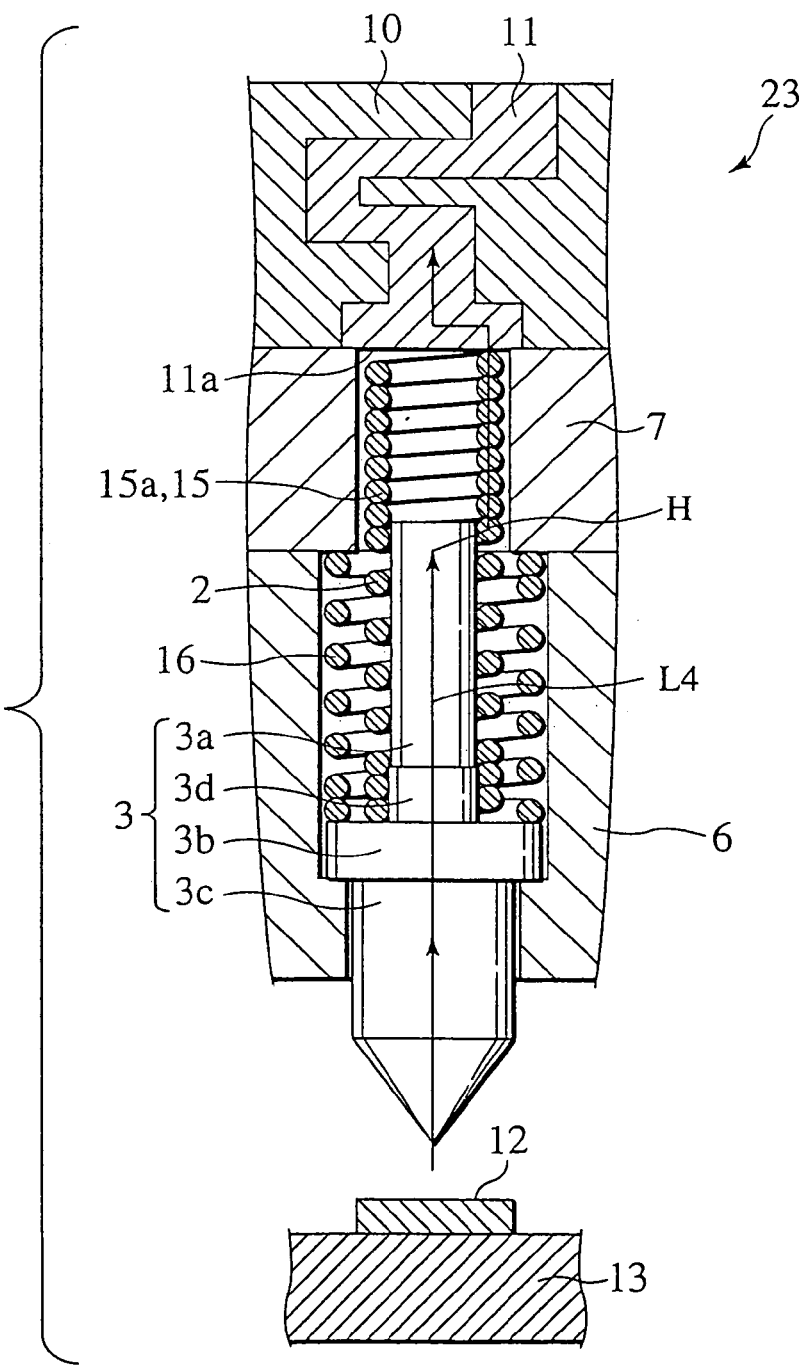
FIG. 6 is a longitudinal section of a microcontactor probe of an electric probe unit according to another embodiment of the invention.

FIG. 6 shows a microcontactor prove 23 according to a fifth embodiment of the present invention. The probe 23 is constituted with a coil spring 2 and a plunger 3 biased by the coil spring 2 to a target 12 of inspection side, which are reciprocatingly movably accommodated in a support hole provided through holders 6 and 7 made of insulating material. In inspection, a wiring plate 10 stacked on the holder 7 and the target 12 are electrically connected via the coil spring 2 and the plunger 3.

In this embodiment, the coil spring 2 has at it one end a tubular portion 15 made of a tight wound spiral portion 15a. One end of the tubular portion 15 is electrically connected with the wiring plate 10. To the other end is joined the plunger 3 having a stem part 3a brought into slidable contact with the tubular portion 15.

More specifically, the coil spring 2 is constituted with at one end the tight wound spiral portion 15a and at the remaining portion a coarse wound spiral portion. The tight wound spiral portion 15a constitutes the tubular portion 15 that allows linear flow of signals. The plunger 3 has a flanged part 3b, on one side of which part 3b a needle head part 3c is formed, and on the other side of which part 3b the long stem part 3a is integrally formed through a boss part 3d. The stem part 3a has a length that allows one end thereof to reach the tight wound spiral portion 15a in a waiting state (the state where the plunger 3 is kept from being in contact with the target 12 of inspection), and has a slightly smaller diameter than that of the boss part 3d. The tight wound spiral portion 15a (tubular portion 15) is left as it is, and at an end of the coarse wound portion, the stem part 3a and the boss part 3d are inserted in the coil to have the coil end tightly wound on the boss part 3d to join the plunger 3 to the coil.

With the plunger assembly thus constituted, the tight wound spiral portion 15a (tubular portion 15) is positioned in a support hole and the plunger 3 is positioned in a support hole for assemblage. The wiring plate 10 is stacked on an upper surface of the holder 7. In this assemblage, a top end of the tight wound spiral portion 15a (tubular portion 15) is brought into resilient contact with a pad 11a of a lead conductor 11 of the wiring plate 10, the plunger 3 has the conical tip of the needle head part 3c projecting outside the holder 6, and the flanged part 3b abuts against a step of a support hole not to fall therefrom.

Further the microcontactor probe 23 has a coaxial double coil spring structure with an auxiliary spring 16 made of a coil spring positioned outside the coil spring 2, like the microcontactor probe 20, to bias only the plunger 3 to the target 12 of inspection side.

A conduction path L4 of signals in inspection with the microcontactor probe 23 thus constituted extends, as shown by solid line arrows in FIG. 6, from the target 12 to the plunger 3, and through the stem part 3a to reach the tight wound spiral spring 15a, and through the tight wound spiral portion 15a to the lead conductor 11 (pad 11a).

Under this condition, the conduction path L4 has a single portion as a sliding portion H for conduction, where the stem part 3a of the plunger 3 is brought into sliding contact with the tight wound spiral portion 15a, thereby permitting the dispersion of resistance to be minimized in inspection.

The microcontactor probe 23 thus constituted has the same functional effects as those of the above-described microcontactor probe 20 and further eliminates a plunger at the wiring plate 10 side, thereby to shorten the conduction path L4 to provide easy assembling and improved high-frequency performance.

Figure 7:
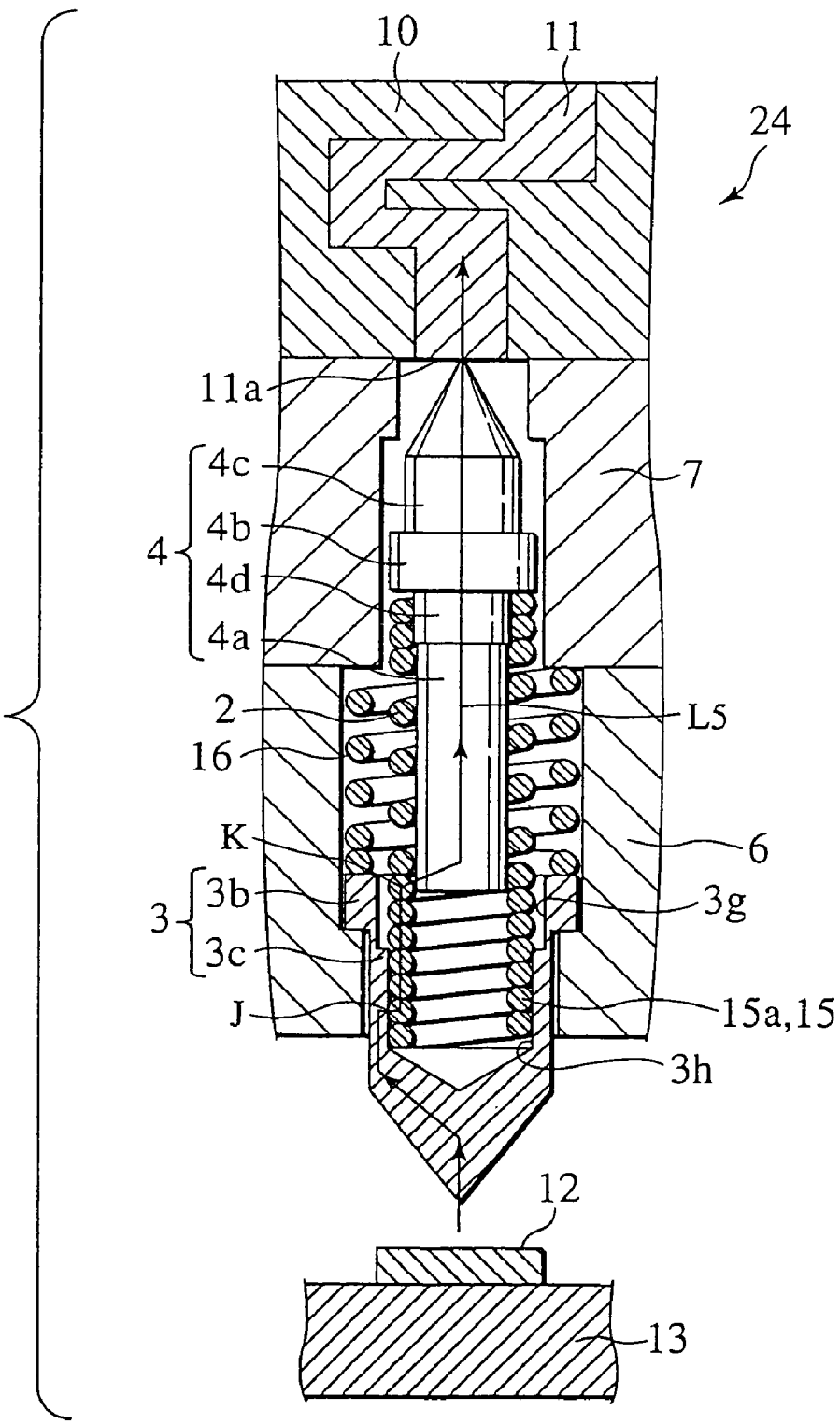
FIG. 7 is a longitudinal section of a microcontactor probe of an electric probe unit according to another embodiment of the invention.

FIG. 7 shows a microcontactor probe 24 according to a sixth embodiment of the present invention. The probe 24 has a tubular portion 15 constituting a tight wound spiral portion 15a formed at one side of a coil spring 2, which portion 15a is inserted at its front end into a tubular part formed in a lower plunger 3 to be fixed thereon. An upper plunger 4 has a stem part 4a brought into slidable contact with the tight wound spiral portion 15a and is joined to the other end side of the coil spring 2.

More specifically, the coil spring 2 has at its one end the tight wound spiral portion 15a and at its remaining part a coarse wound spiral portion. The portion 15a constitutes the tubular portion 15 that permits linear flow of signals.

The lower plunger 3 has a flanged part 3b, on one side of which part 3b formed is a needle head part 3c. The needle head part 3c has an inside part hollowed out to form a tubular part having an opening at the flanged part 3b side. The tubular part is, in this embodiment, formed with a step to have a small-diameter tubular part 3h at the bottom side and a large-diameter tubular part 3g at the opening side. The upper plunger 4 has a flanged part 4b, on one side of which part 4b, a needle head part 4c is formed, and on the other side of which part 4b, a long stem part 4a is integrally formed via a boss part 4d. The stem part 4a has a length that allows a top end thereof to reach the tight wound spiral portion 15a in the state as shown in FIG. 7 (the state where the lower plunger 3 is kept from being in contact with a target 12 for inspection), and has a slightly smaller diameter than that of the boss part 4d.

The tight wound spiral portion 15a (tubular portion 15) is at its front end press-fitted into the small-diameter tubular portion 3h to be fixed. At an end of the coarse wound spiral portion, the stem part 4a and the boss part 4d are inserted into the coil to have the coil end tightly wound on the boss part 4d to join the plunger 4 to the coil. The fixation of the top end of the tight wound spiral portion 15a can be additionally done by soldering in addition to the press fitting, to improve electrical performance.

In the plunger assembly thus constituted, the upper plunger 4 is positioned inside a support hole of a holder 7 and the lower plunger 3 is positioned inside a support hole of a holder 6 to fix them to the holders 7 and 6, and a wiring plate 10 is stacked on the upper surface of the holder 7, whereby the conical tip of the needle head part 4c of the plunger 4 is brought into contact with a pad 11a of a lead conductor 11 of the wiring plate 10 for electrical connection.

Further, the microcontactor probe 24 has, like the microcontactor probe 20, a coaxial double coil spring structure with an auxiliary spring 16 made of a coil spring positioned outside the coil spring 2, to bias only the lower plunger 3 to the target 12 of inspection.

A conduction path L5 of signals in inspection with the microcontactor probe 24 extends, as shown by solid line arrows in FIG. 7, from the target 12 through the needle head part 3c of the plunger 3 to reach the tight wound spiral portion 15a, and from the portion 15a through the stem part 4a to reach the lead conductor 11 (pad 11a) through the plunger 4.

In the conduction path L5, the tight wound spiral portion 15a and the needle head part 3c constitute a fixed part J for conduction. The path L5 has a single portion as a sliding portion K for conduction, where the stem part 4a of the plunger 4 is brought into sliding contact with the tight wound spiral portion 15a (tubular portion 15), thereby permitting the dispersion of resistance to be minimized in inspection.

In the microcontactor probe 24 thus constituted, the tubular portion 15 made of the tight wound spiral portion 15a is at its front end fitted into the tubular part (a small-diameter tubular part 3h) of the plunger 3 to be firmly fixed, so that a stable electrical connection with the plunger 3 can be obtained. Further the tubular portion 15 of the tight wound spiral portion 15a is in the remaining part in a free state in the circumferential direction, so that an adequate lateral load can be applied to the stem part 4a of the plunger 4, which provides a stable electrical connection.

Thus the microcontactor probe 24 has the same functional effects as those of the above-described microcontactor probe 20 and further provides stable electrical connection of the tubular portion 15 comprising the tight wound spiral portion 15a between the lower and upper plungers 3 and 4, which ensures more reliable inspection.

Figure 8:
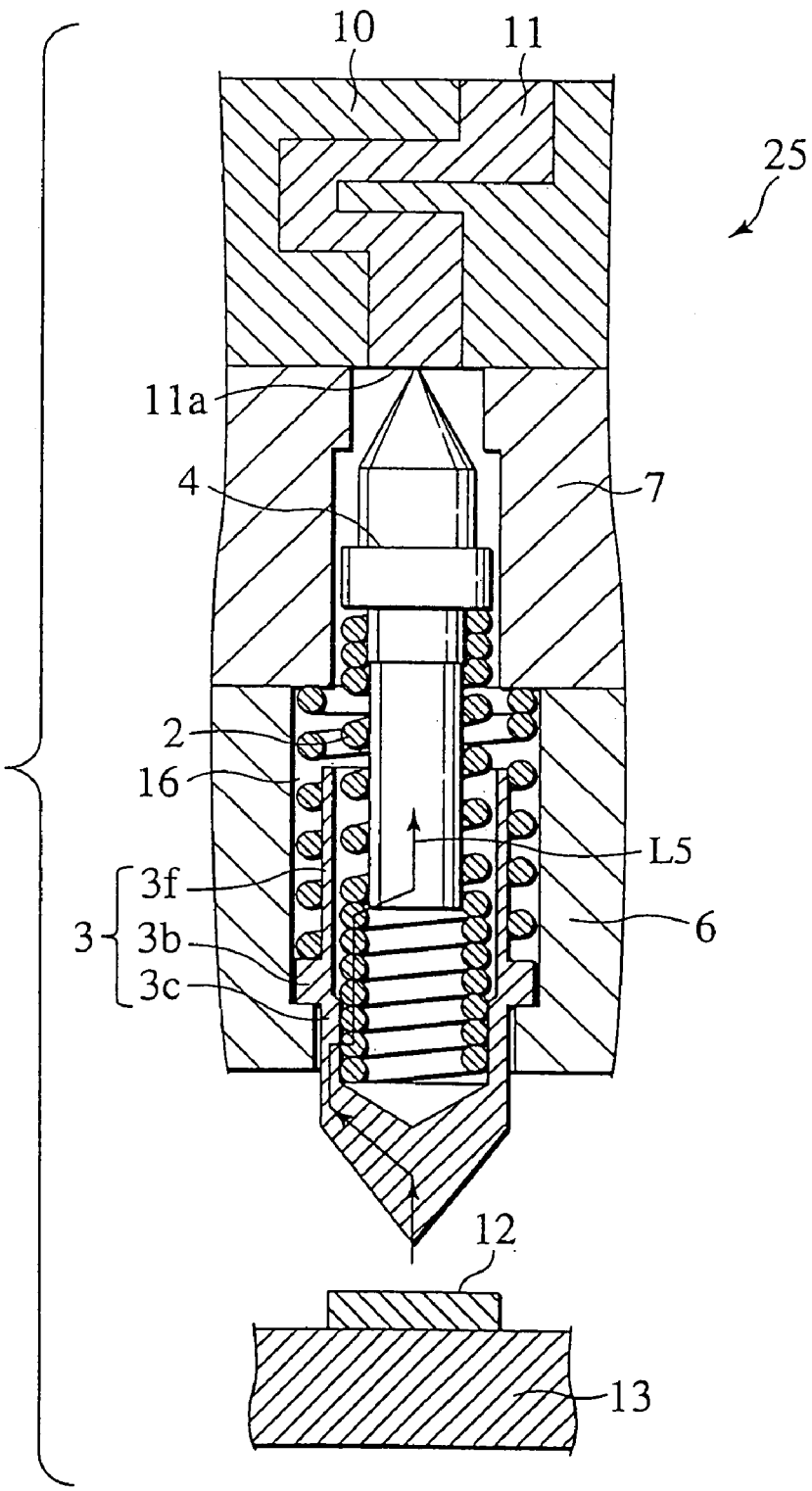
FIG. 8 is a longitudinal section of a microcontactor probe of an electric probe unit according to another embodiment of the invention.

FIG. 8 shows a microcontactor probe 25 according to a seventh embodiment of the present invention. The probe 25 has the same structure as that of the above-described microcontactor probe except that the probe 25 has a shielding tube 3f as an extension of a lower plunger 3 between a coil spring 2 and an auxiliary spring 16 serving as a partition between the springs 2 and 16.

Thus the microcontactor probe 25 has similar functional effects as those of the probe 24 and further secures adequate inspection by partitioning the auxiliary spring 16 and the coil spring 2 with the shielding tube 3f to prevent them from interfering with each other, thereby providing stable operation.

Figure 9:
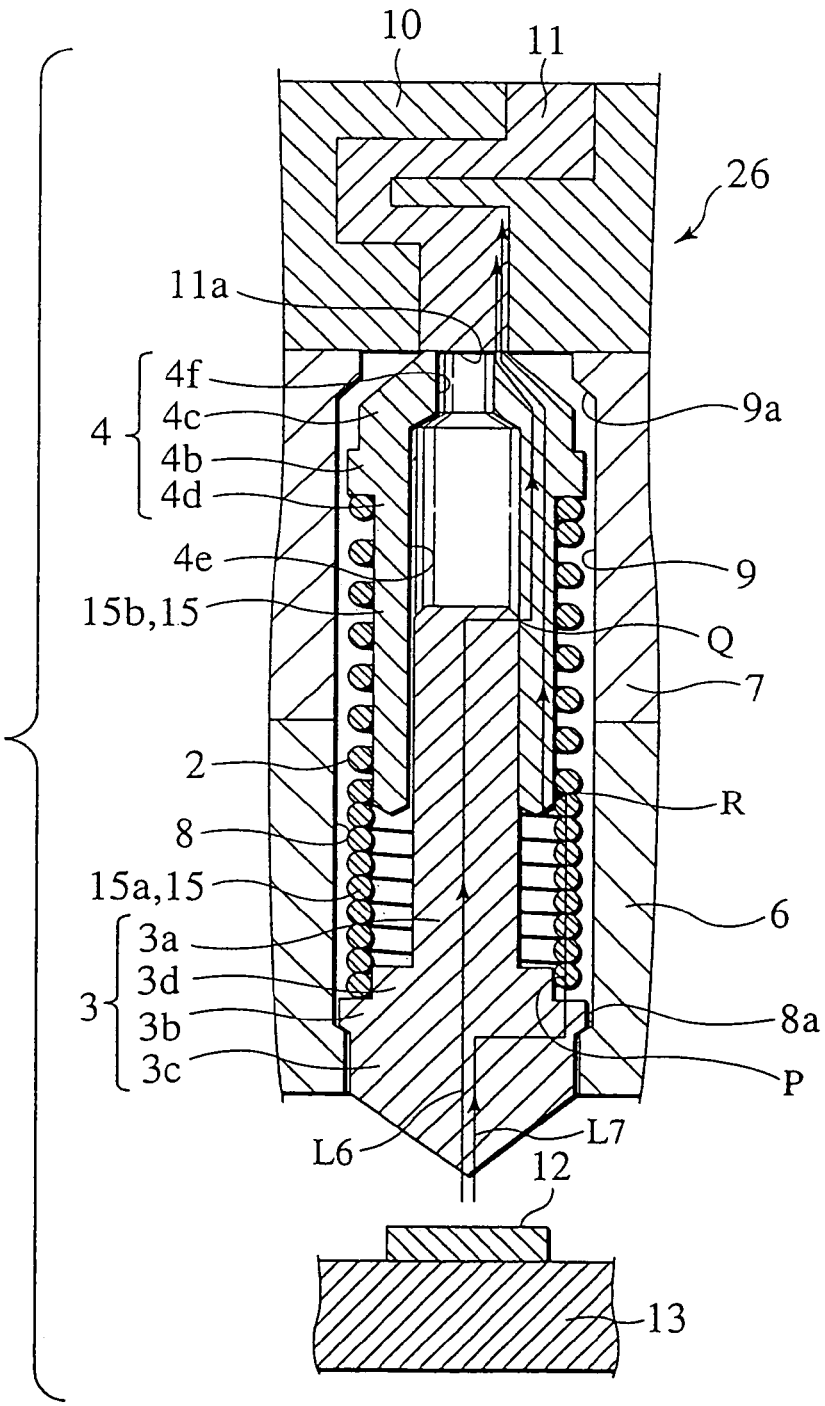
FIG. 9 is a longitudinal section of a microcontactor probe of an electric probe unit according to another embodiment of the invention.

FIG. 9 shows a microcontactor probe 26 according to an eighth embodiment of the present invention. The probe 26 is different from the other embodiments in that it has a tubular portion 15 providing linear flow of signals constituted with an upper plunger 4 and a coil spring 2.

More specifically, the probe 26 has the tubular portion 15 constituted with two tubular portions, a tubular part 15b as an extension of the plunger 4 and a tight wound spiral portion 15a formed on one side of the coil spring 2. A lower plunger 3 has a stem part 3a slidably inserted into the tubular part 15b.

The paired plungers 3 and 4 are aligned movably in the axis direction with the stem part 3a inserted into the tubular part 15b. The coil spring 2 is disposed outside the tubular part 15b and the stem part 3a. The tight wound spiral portion 15a is brought into slidable contact with the tubular part 15b with one end thereof joined to the plunger 3. The other end of the spiral portion 15a is joined to the plunger 4. Thus the paired plungers 3 and 4 are joined together.

More specifically, the plunger 3 has a flanged part 3b, on one side of which part 3b a needle head part 3c is formed, and on the other side of which part 3b a long stem part 3a is integrally formed through a boss part 3d. The plunger 4 has a flanged part 4b, on one side of which part 4b a needle head part 4c is formed, and on the other side of which part 4d a boss part 4d is integrally formed.

The tubular part 15b is extended to the boss part 4d to be integrally formed with the plunger 4. A hollow part 4e of the tubular part 15b reaches at the needle head part 4c side the middle part of the needle head part 4c and is communicated with the outside through a plating hole 4f formed at the end of the needle head part 4c. The plating hole 4f is provided for good flow of plating liquid and serves to stabilize plating on the wall of the hollow part 4e and minimize sliding resistance of the stem part 3a.

The coil spring 2 is constituted at one end thereof with a tight wound spiral portion 15a and at the other end thereof with a coarse wound spiral portion. In the tight wound spiral portion 15a, the plunger 3 is fixed with the stem part 3a inserted into the coil and the boss part 3d press-fitted to an end of the coil. To an end of the coarse wound spiral portion, the plunger 4 is joined with the tubular part 15 inserted into the coil outside the stem part 3a and an end of the coil tightly wound on the boss part 4d.

The plunger assembly thus constituted is mounted, as in the first embodiment (microcontactor probe 1), with the plunger 4 positioned in a support hole 9 of a holder 7, the plunger 3 positioned in a support hole 8 of a holder 6, and a wiring plate 10 stacked on an upper surface of the holder 7.

This mounting realizes the microcontactor probe 26 in a waiting state (the state where the plunger 3 is kept from being in contact with a target 12 of inspection) as shown in FIG. 9 in which the needle head part 4c of the plunger 4 is brought into resilient contact with a pad 11a of a lead conductor 11, and the needle head part 3c of the plunger 3 is projected outside, being prevented from falling. In this state, the tubular part 15b and the tight wound spiral portion 15a partially overlap one another at their ends in the waiting state, and have respective lengths that allow the plunger 3 to be pushed back in inspection. The tubular part 15b and the stem part 3a have respective lengths that provide appropriate insertion of the stem part 3a into the tubular part 15b in the waiting state, and allow the plunger 3 to be pushed back in inspection.

The microcontactor probe 26 thus constituted applies lateral contact pressure with the coil spring 2 having flexibility to the paired plungers 3 and 4 in the direction perpendicular to the central axis. The lateral contact pressure provides two conduction paths by a sliding portion Q for conduction where the stem part 3a contacts the tubular part 15b (tubular portion 15) to connect the paired plungers 3 and 4 with each other to form a first conduction path L6, and by a sliding portion R for conduction where the tubular part 15b contacts the tight wound spiral part 15a (tubular portion 15) to connect the paired plungers 3 and 4 through the tight wound spiral portion 15a to form a second conduction path L7.

More specifically, signals in inspection with the probe 26 are transmitted along the first conduction path L6 and the second conduction path L7 as shown by solid line arrows in FIG. 8. The first conduction path L6 extends from the target 12 of inspection to the lower plunger 3, and through the stem part 3a to the tubular part 15b and the upper plunger 4, and through the plunger 4 to the lead conductor 11 (pad 11a). The second conduction path L7 extends from the target 12 to the lower plunger 3, and from the boss part 3d through the tight wound spiral part 15a and the tubular part 15b to the upper plunger 4, and through the plunger 4 to the lead conductor 11 (pad 11a).

The first and second conduction paths L6 and L7 are constituted without the coarse wound spiral portion of the coil spring 2, which prevents increase of inductance and resistance caused by the flow of high-frequency signals in coil, thereby to reduce inductance and resistance.

The tight wound spiral part 15a is firmly fixed on the plunger 3 in an integrally conductive state with the plunger 3, so that their connecting portion P does not constitute a sliding portion for conduction but a fixed portion for conduction. The tubular part 15b is an extension of the plunger 4. Thus an integrally continuous conduction path is formed through the spiral portion 15a and the tubular part 15b.

Under this condition, the first conduction path L6 has a single portion as a sliding portion Q for conduction, where the stem part 3a of the plunger 3 is brought into sliding contact with the tubular part 15b. The second conduction path L7 has a single portion as a sliding portion R for conduction, where the tubular part 15b is brought into sliding contact with the tight wound spiral portion 15a. Each of the first and second conduction paths L6 and L7 has a single sliding conduction portion, thereby permitting the dispersion of resistance to be minimized in inspection.

Accordingly, the microcontactor probe 26 with the first and second conduction paths L6 and L7 provides more stable conduction of inspection signals under lower resistance as compared with the above embodiments with a single conduction path.

Figure 10:
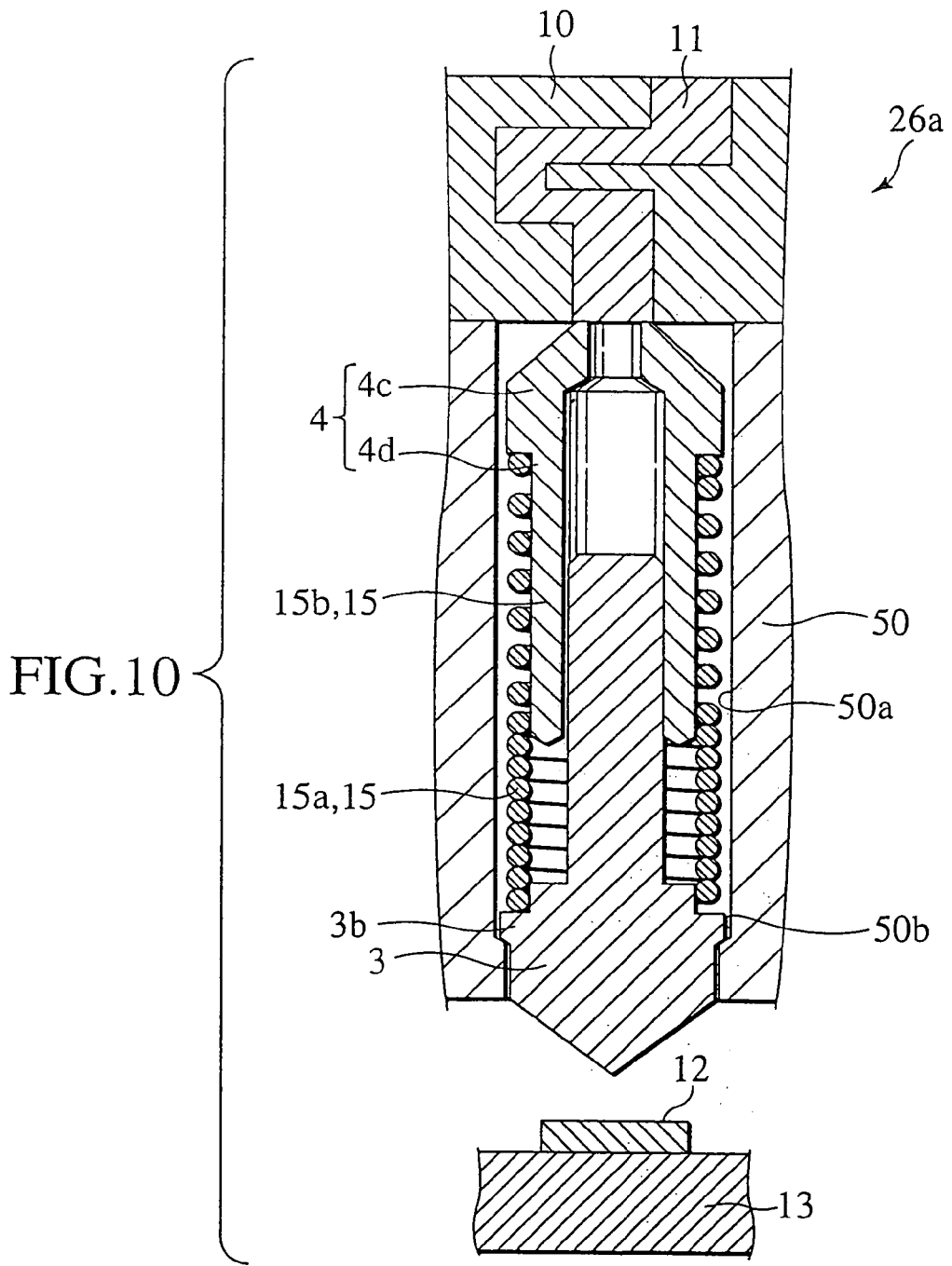
FIG. 10 is a longitudinal section of a microcontactor probe of an electric probe unit according to another embodiment of the invention.

FIG. 10 shows a microcontactor probe 26a according to a modification of the eighth embodiment of the present invention. The probe 26a has the same structure as that of the probe 26 except that a single holder 50 is used and an upper plunger 4 has a different shape.

More specifically, the holder 50 is made of a insulating material having an appropriate thickness that allows the hollowing out of a support hole 50a for accommodating upper and lower plungers 3 and 4 biased in opposite directions by a coil spring 2, which plungers are reciprocatingly movable. The support hole 50a is provided with a step 50b near an opening opposite to a wiring plate 10 to prevent the plungers from falling out.

The upper plunger 4 is constituted with a needle head part 4c and a boss part 4d integrally formed on the rear side of the needle head part 4c, without a flanged part 4b as shown in the above embodiment.

In the probe 26a, the plunger assembly constituted with the paired plungers 3 and 4 joined to the coil spring 2 is, as in the probe 26, inserted from an opening opposite to the step 50b side with the plunger 3 at the front, into the support hole 50a to be engaged at a flanged part 3b with the step 50b, to prevent the plunger 3 from falling out, and the wiring plate 10 is stacked on the holder to bring the needle head part 4c of the plunger 4 into contact with a pad 11a of the lead conductor 11.

With the probe 26a thus constituted, the plunger assembly can be easily exchanged by demounting the wiring plate 10 from the holder 50. Thus the probe 26a improves workability in maintenance as well as providing the functional effects of the probe 26.

Further, this structure can also be applied to the microcontactor probe 1 to improve workability in maintenance.

Figure 11:
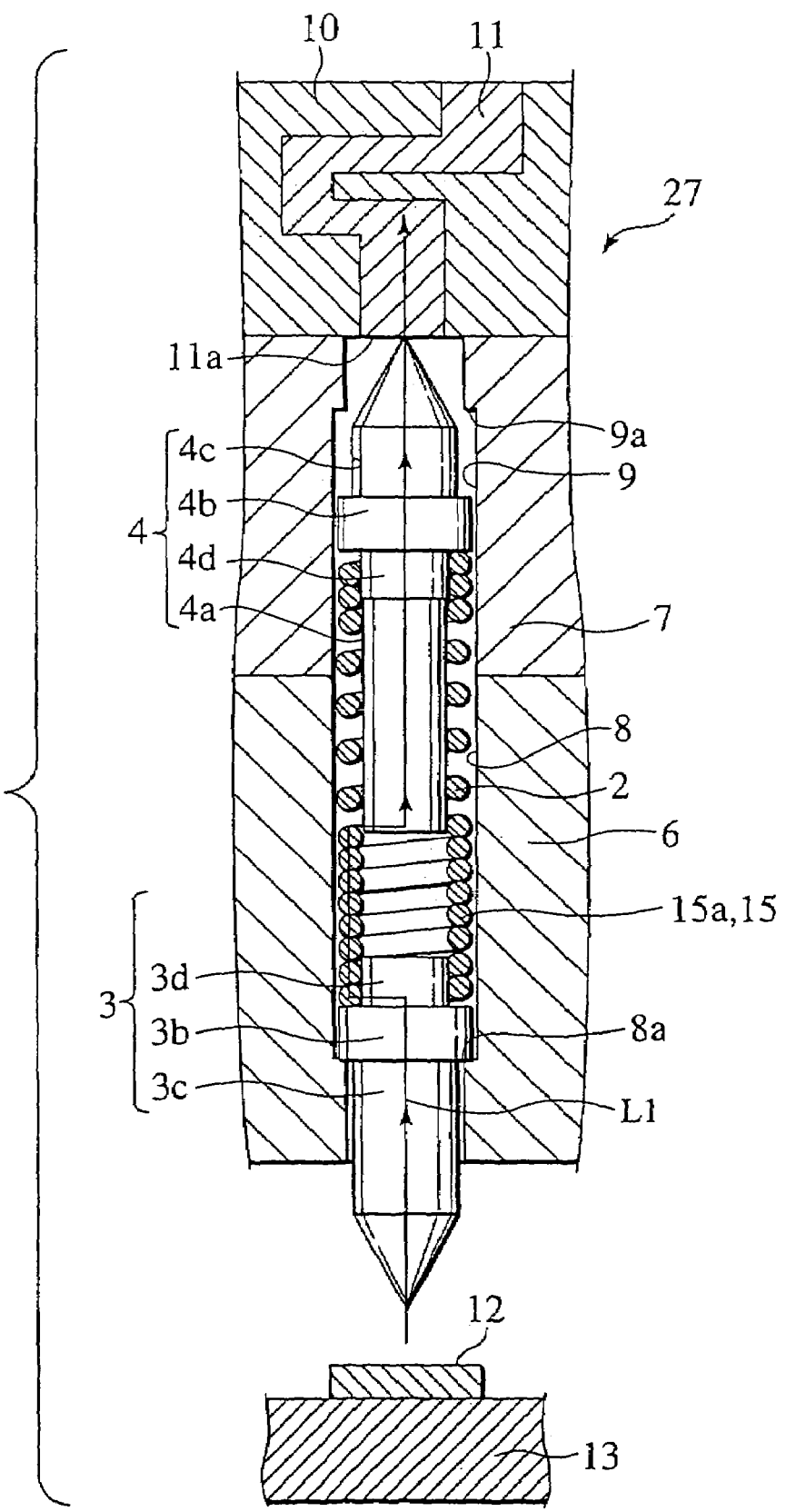
FIG. 11 is a longitudinal section of a microcontactor probe of an electric probe unit according to another embodiment of the invention.

FIG. 11 shows a microcontactor probe 27 as a modification of the first embodiment of the present invention. The probe 27 corresponds to an up-down inverted structure of the probe 1 of FIG. 2, such that a coil spring 2 has a tight wound spiral portion 15a as a tubular portion 15 formed at the side of an inspection target 12, to be fixed at a lower end thereof on a boss part 3d of a lower plunger 3, and an upper plunger 4 has a stem part 4a slidably contacting at the lower end on an inside of an upper end of the tubular portion 15. There can be achieved similar effects to the first embodiment.

Figure 12:
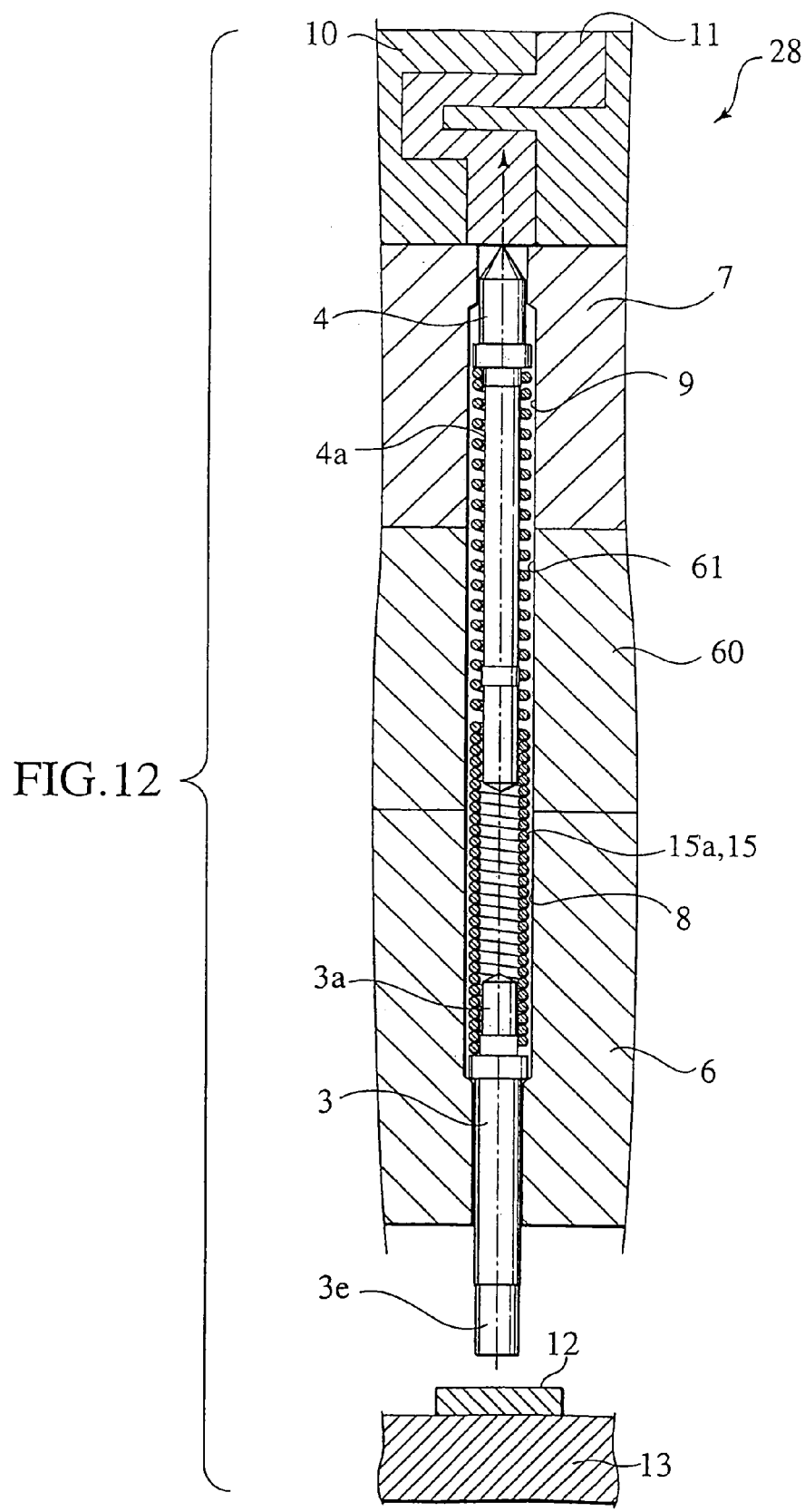
FIG. 12 is a longitudinal section of a microcontactor probe of an electric probe unit according to another embodiment of the invention.
Figure 13:
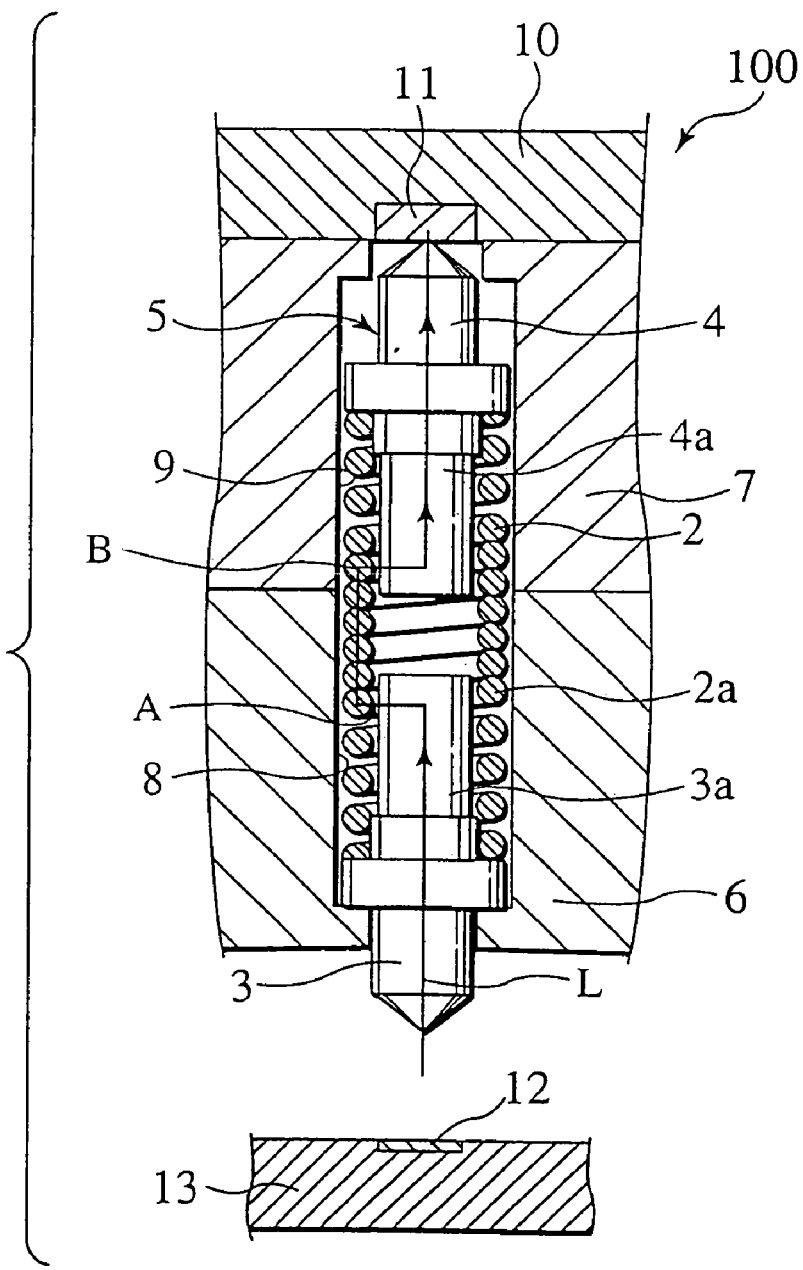
FIG. 13 is a longitudinal section of a microcontactor probe of a conventional electric probe unit.

FIG. 12 shows a microcontactor probe 28 as a variation of the modification of the first embodiment. The probe 28 corresponds to an elongated and/or diameter-reduced structure of the probe 27 of FIG. 11. Note that lower and upper holders 6 and 7 have another holder 60 interposed therebetween and formed with a support hole 61 matching in diameter with support holes 8 and 9 of the lower and upper holders 6 and 7.

Moreover, a lower plunger 3 made of Paliney No. 7 (Pd 35%, Ag 30%, Pt 10%, Au 10%, Cu 14%, and Zn 1%) has a short stem part 3a, and an upper plunger 4 made of a quenched Fe material prepared with a Ni plate and finished with a Au plate has a well conductive long stem part 4a. This stem part 4a is by far longer than that stem part 3a. The upper plunger 4 needs a processing with higher precision than the lower plunger 3. The upper plunger 4 may be scarcely substituted with another size. The lower plunger 3 may well be substituted with a variety of different types, allowing for short-pitch targets to be coped with.

Further, the upper plunger 4 has an excellent workability. To the contrary, Paliney No. 7 as a precious metal is high of hardness, resistive to abrasion, high of conductivity, resistive to surface oxidation, and small of rise of resistance. When the surface is stained by solder or the like, it can be shaved for reuse. The lower plunger 3 thus has a flat distal end 3e.

As will be seen from the foregoing embodiments, there is disclosed herein a microcontactor probe as a first implementation of the present invention in which a pair of plungers biased in opposite directions by a main coil spring are accommodated in a reciprocally movable manner in a support hole provided in a holder made of insulator, either plunger being installed to be projected outward and prevented from coming off and the other plunger being installed to be electrically connected to a wiring plate laminated on the holder, wherein at least one of the plungers and the main coil spring has formed therein a tubular portion allowing for a linear flow of electric signal, and wherein, out of the pair of plungers, one plunger is in an integrated condition for electrical conduction to the tubular portion, and the other plunger is electrically connected in a slidable manner to the tubular portion.

According to the first implementation, there are three cases: one in which the tubular portion is formed simply in the main coil spring, another in which it is formed simply in a plunger, and the other in which both main coil spring and plunger are formed with tubular portions. In any case, the pair of plungers biased in opposite directions by the main coil spring are electrically connected by the tubular portion(s), thereby preventing a high-frequency signal from spirally flowing a coarse wound spiral portion of the coil spring which has an additional inductance and an additional resistance, thus achieving reduction of inductance and resistance.

Further, because the tubular portion is in an integrated condition for electrical conduction relative to the one plunger, there is an interconnecting portion therebetween that can serve as a fixed part for conduction, not a sliding part therefor. Under this condition, the conduction path constituted with the paired plungers and the tubular portion has a single portion as a sliding portion for conduction, where the other plunger is brought into sliding contact, thereby permitting the dispersion of resistance to be minimized in inspection.

It is noted that the phrase "the plunger is in an integrated condition for electrical conduction to the tubular portion" means, in the case of a tubular portion formed in the main coil spring, that the tubular portion is integrally connected to the plunger by means of press-fitting, soldering, brazing, or the like, and in the case of a tubular portion formed in the plunger, either that the tubular portion is integrally connected to the plunger by means of press-fitting, soldering, brazing, or the like or that the tubular portion is integrally formed in the plunger.

According to a second implementation of the present invention, in a microcontactor probe according to the first implementation, the tubular portion comprises a tight wound spiral portion formed at one end of the main coil spring and fixed to the one plunger, and the other plunger has a stem part slidably contacting the tight wound spiral portion, to be connected to the other end of the main coil spring.

According to the second implementation, the one plunger and the tight wound spiral portion are interconnected by a fixed part for conduction, and the conduction path has a single portion as a sliding portion for conduction, where the other plunger is brought into sliding contact, thereby permitting the dispersion of resistance to be minimized in inspection.

According to a third implementation of the present invention, in a microcontactor probe according to the first implementation, the tubular portion comprises a tubular part as an extension of the one plunger, the other plunger is slidably inserted into the tubular part, and the main coil spring is inserted inside the tubular part for biasing the one and the other plungers to be spaced from each other.

According to the third implementation, the conduction path comprises the pair of plungers and a tubular part, with the one plunger being integrated with the tubular part to constitute a continuous conduction path that has a single sliding part for conduction, where the other plunger is brought into contact on the tubular part, thereby permitting the dispersion of resistance to be minimized in inspection.

According to a fourth implementation of the present invention, in a microcontactor probe according to any of the first to third implementations, that one of the pair of plungers which contacts the inspection target is biased, with a greater spring load than the plunger electrically connected to the wiring plate, by an auxiliary spring installed between that plunger and the holder.

According to the fourth implementation, electrical connections of the plungers can be ensured, to the inspection target with a relatively great contact pressure, and to the wiring plate with a relatively small contact pressure.

According to a fifth implementation of the present invention, in a microcontactor probe according to the fourth implementation, the auxiliary spring comprises a coil spring disposed outside the main coil spring that biases the pair of plungers, thus cooperating with the main coil spring to constitute a coaxial double coil spring structure.

According to the fifth implementation, the auxiliary spring is configured to constitute a coaxial double coil spring structure together with the main coil spring, and can be installed in a narrow space.

According to a sixth implementation of the present invention, in a microcontactor probe according to the fifth implementation, the auxiliary and main coil springs constituting the double coil structure have their coil portions free from mutual binding or interference.

According to the sixth implementation, the auxiliary and main coil springs are kept from interfering with each other, allowing an ensured adequate operation for inspection.

According to a seventh implementation of the present invention, in a microcontactor probe according to the fourth implementation, the auxiliary spring comprises a coil spring installed outside the tubular part.

According to the seventh implementation, the auxiliary spring is adapted, by the tubular part, to constitute a non-bendable interference-free structure relative to a coil portion of the main coil spring in the tubular part, so that the auxiliary and main coil springs are kept from mutual interference, allowing an ensured adequate operation for inspection.

Further, there is disclosed herein a microcontactor probe as an eighth implementation of the present invention in which a main coil spring and a plunger biased by the main coil spring toward the side of an inspection target are accommodated in a reciprocally movable manner in a support hole provided in a holder made of insulator and in which, upon an inspection, a wiring plate laminated on the holder and the inspection target are electrically interconnected by the main coil spring and the plunger, wherein the main coil spring has a tubular portion formed as a tight wound spiral portion at one end side thereof, and the tubular portion is electrically connected at one end thereof to the wiring plate and joined at the other end thereof to the plunger which has a stem part slidably contacting the tubular portion, and wherein the plunger is biased toward the inspection target side, by an auxiliary spring installed between the plunger and the holder, with a greater spring load than at the end of the tubular portion electrically connected to the wiring plate.

According to the eighth implementation, the plunger, which is biased by the main coil spring and brought into contact with the inspection target, is electrically connected to the wiring plate via the tubular portion constituted as a tight sound spiral portion, thus preventing a high-frequency signal from flowing a coarse wound spiral portion of the coil spring which has an additional inductance and an additional resistance, thereby permitting reduction of inductance and resistance.

Under this condition, the conduction path has a single portion as a sliding portion for conduction, where a stem part of the plunger contacting the inspection target is brought into slidable contact on the tubular portion made as a tight wound spiral portion, thereby permitting the dispersion of resistance to be minimized in inspection.

Moreover, the elimination of a plunger at the wiring plate side allows for commensurate reduction in number of components and length of conduction path.

Further, for electrical connection, the plunger is adapted to resiliently contact the inspection target with a relatively large contact pressure, and the tubular portion constituted as a tight wound spiral portion is adapted to resiliently contact the wiring plate with a relatively small contact pressure.

According to a ninth implementation of the present invention, in a microcontactor probe according to the first, fourth, fifth, or sixth implementation, the tubular portion comprises a tight wound spiral portion formed at one end of the main coil spring and fixed, by fitting a distal end part of the tight wound spiral portion, in a tube part formed in the one plunger, and the other plunger has a stem part slidably contacting the tight wound spiral portion, to be connected to the other end of the main coil spring.

According to the ninth implementation, the tubular portion constituted as a tight wound spiral portion is fixed by fitting a distal end part thereof in the tube part of the one plunger, with a stable electrical connection achieved relative to the one plunger.

Further, the tubular portion constituted as a tight wound spiral portion has the other part than the distal end part thereof free in the circumferential direction, so that an adequate lateral load can be applied to the stem part of the other plunger, thereby achieving a stable electrical connection.

According to a tenth implementation of the present invention, in a microcontactor probe according to the ninth implementation, the one plunger has a shielding tube part as an extension thereof interposed between the main coil spring and the auxiliary spring, for a partitioning between coil portions of the two springs.

According to the tenth implementation, the auxiliary and main coil springs are separated by the shielding tube part, to be free of mutual interference, for an adequate inspection operation to be ensured.

According to an eleventh implementation of the present invention, in a microcontactor probe according to the first implementation, the tubular portion comprises two tubular portions as combination of a tubular part as an extension of the one plunger and a tight wound spiral portion formed at one end side of the main coil spring, the other plunger has a stem part to be slidably inserted into the tubular portion, the pair of plungers are arrayed to be mutually axially movable by inserting the stem part into the tubular portion, and the main coil spring is disposed outside the tubular portion and the stem part and connected to the pair of plungers, with the tight wound spiral portion slidably contacting the tubular part, to be joined at one end side thereof to the other plunger and at the other end side thereof to the one plunger.

According to the eleventh implementation, the main coil spring is adapted by its flexibility to exert, on the pair of plungers, a contact pressure in a lateral direction substantially perpendicular to the center axis. By exertion of the lateral contact pressure, there are established two conduction paths: a first conduction path established through the pair of plungers in current communication with each other, having a conductive sliding portion in which the stem part contacts the tubular part; and a second conduction path established through the pair of plungers in current communication with each other via the tight wound spiral portion, having a conductive sliding portion in which the tubular part contacts the tight wound spiral portion. The two conduction paths each has a single sliding part for conduction, thereby permitting the dispersion of resistance to be minimized in inspection.

According to a twelfth implementation of the present invention, in a microcontactor probe according to the first, second, or eleventh implementation, the support hole is pierced in the holder, having a stepped part for falling prevention simple near an opening at the opposite side of the wiring plate.

According to the twelfth implementation, removal of the wiring plate from the holder permits facilitated insertion and takeout of the plunger assembly relative to the support.

As will be seen from the foregoing description, according to the first implementation:

(1) the pair of plungers biased in opposite directions by the main coil spring are electrically connected by the tubular portion(s), thereby preventing a high-frequency signal from spirally flowing a coarse wound spiral portion of the coil spring which has an additional inductance and an additional resistance, thus achieving reduction of inductance and resistance; and (2) the tubular portion is in an integrated condition for electrical conduction relative to the one plunger, there is an interconnecting portion therebetween that can serve as a fixed part for conduction, not a sliding part therefor, under which condition, the conduction path constituted with the paired plungers and the tubular portion has a single portion as a sliding portion for conduction, where the other plunger is brought into sliding contact, thereby permitting the dispersion of resistance to be minimized in inspection, whereby it is achieved to provide a microcontactor probe and an electric probe unit, in which a conduction path has a reduced number of sliding portions for conduction, without increase in inductance nor resistance, thereby permitting an enhanced accuracy of inspection.

According to the second implementation, the conduction path has a single portion as a sliding portion for conduction, where the other plunger is brought into sliding contact, thereby permitting the dispersion of resistance to be minimized in inspection, resulting in an enhanced inspection accuracy.

According to the third implementation, the conduction path has a single sliding part for conduction, where the other plunger is brought into contact on the tubular part, thereby permitting the dispersion of resistance to be minimized in inspection, resulting in an enhanced inspection accuracy.

According to the fourth implementation, electrical connections of the plungers can be ensured, to the inspection target with a relatively great contact pressure, and to the wiring plate with a relatively small contact pressure, whereby it is achieved in addition to the effects of any of the first to third implementations to provide a microcontactor probe in which damages are suppressed at the wiring plate side and the electrical connection to the inspection target is stable, permitting an enhanced service life of the wiring plate.

According to the fifth implementation, the auxiliary spring is configured to constitute a coaxial double coil spring structure together with the main coil spring, and can be installed in a narrow space, permitting a suppressed enlargement of an entirety of apparatus in addition to the effects of the fourth implementation.

According to the sixth implementation, in addition to the effects of the fifth implementation, the auxiliary and main coil springs are kept from interfering with each other, allowing an ensured adequate operation for inspection, thereby permitting a stable operation.

According to the seventh implementation, in addition to the effects of the fourth implementation, by the tubular part, the auxiliary and main coil springs are kept from mutual interference, allowing an ensured adequate operation for inspection, thereby permitting a stable operation.

According to the eighth implementation, in addition to the effects of the first implementation, the elimination of a plunger at the wiring plate side allows for commensurate reduction in number of components and length of conduction path, thereby permitting enhanced assembling nature and high-frequency performance.

Further, for electrical connection, the plunger is adapted to resiliently contact the inspection target with a relatively large contact pressure, and the tubular portion constituted as a tight wound spiral portion is adapted to resiliently contact the wiring plate with a relatively small contact pressure, whereby damages are suppressed at the wiring plate side and the electrical connection to the inspection target is stable, permitting an enhanced service life of the wiring plate.

According to the ninth implementation, the tubular portion constituted as a tight wound spiral portion provides a stable electrical connection between the one and the other plungers, permitting an enhanced reliability to be ensured of inspection operation.

According to the tenth implementation, the auxiliary and main coil springs are separated by the shielding tube part, to be free of mutual interference, for an adequate inspection operation to be ensured, thereby permitting a stable operation.

According to the eleventh implementation, by exertion of the lateral contact pressure, there are established two conduction paths: a first conduction path established through the pair of plungers in current communication with each other, having a conductive sliding portion in which the stem part contacts the tubular part; and a second conduction path established through the pair of plungers in current communication with each other via the tight wound spiral portion, having a conductive sliding portion in which the tubular part contacts the tight wound spiral portion, whereby it is achieved to have the resistance suppressed the lower, and high-frequency characteristics such as inductance the more enhanced.

According to the twelfth implementation, removal of the wiring plate from the holder permits facilitated replacement of the plunger assembly, permitting a enhanced maintenance service.

As will be seen from the foregoing description, the present invention has been made in consideration of a preferable contact condition that can be implemented with a small contact pressure such as when a wiring plate has a Au-plated copper film as a conductive part, and it also is an object of the present invention to provide a microcontactor probe and an electric probe unit, in which a plunger to be brought into contact with an inspection target can be biased with a greater spring load than a plunger electrically connected to a wiring plate, thereby permitting the wiring plate to have an enhanced service life, without reduction in inspection accuracy.

While embodiments of the present invention have been described using specific terms, such description is for illustrative purposes, and it is to be understood that changes and variations may be made without departing from the scope of the following claims.

INDUSTRIAL APPLICABILITY

The present invention is applicable to a microcontactor probe and an electric probe unit, in which a conduction path has a reduced number of sliding portions for conduction, without increase in inductance nor resistance, thereby permitting an enhanced accuracy of inspection.

The invention claimed is:

1. A microcontactor probe comprising:
an insulator formed with a support hole having an open end and a close end;
a lead conductor exposed inside the support hole at the close end; and
a resilient conductive assembly fitted in the support hole and kept from falling, the conductive assembly comprising:
a first plunger exposed outside at the open end;
a second plunger contacting the lead conductor;
a tubular conductor portion on one of the first and second plungers,
a stem part of the other one of the first and second plungers, at least a portion of the stem part establishing a substantially concentric relationship with the tubular conductor portion at least during a probe operation, the concentric relationship of the tubular conductor portion with the stem part minimizing resistance and induction during a probe operation; and
a coil spring fitted on the first and second plungers, the coil spring having a connected tight wound portion fixed to said one of the first and second plungers at a fixed part for conduction, the tight wound portion slidably contacting said other of the first and second plungers, whereby the tight wound portion minimizes resistance and induction during a probe operation.

2. A microcontactor probe according to claim 1, wherein the tubular conductor portion comprises a tubular part of the second plunger defining a hollow.

3. An electric probe unit comprising a plurality of microcontactor probes according to claim 1.

4. A microcontactor probe comprising:
an insulator formed with a support hole having an open end and a close end;
a lead conductor exposed inside the support hole at the close end; and
a resilient conductive assembly fitted in the support hole and kept from falling, the conductive assembly comprising:
a first plunger exposed outside at the open end;
a second plunger contacting the lead conductor;
a tubular conductor portion of one of the first and second plungers;
a stem part of the other of the first and second plungers, at least a portion of the stem part establishing a substantially concentric relationship with the tubular conductor portion at least during a probe operation, the concentric relationship of the tubular conductor portion with the stem part minimizing resistance and induction during a probe operation; and
a coil spring fitted on the first and second plungers, the coil spring including at least a portion of the coil spring forming a conduction path configured to minimize resistance and induction during a probe operation,
the coil spring having a connected tight wound portion fixed to said one of the first and second plungers at a fixed part for conduction, the tight wound portion slidably contacting said other of the first and second plungers, whereby the tight wound portion minimizes resistance and induction during a probe operation.

5. A microcontactor probe according to claim 4, wherein the tubular conductor portion comprises a tubular part of the second plunger defining a hollow.

6. An electric probe unit comprising a plurality of microcontactor probes according to claim 4.

* * * * *